United States Patent
Chen et al.

(10) Patent No.: US 10,796,990 B2
(45) Date of Patent: Oct. 6, 2020

(54) SEMICONDUCTOR STRUCTURE, PACKAGE STRUCTURE, AND MANUFACTURING METHOD THEREOF

(71) Applicant: Taiwan Semiconductor Manufacturing Co., Ltd., Hsinchu (TW)

(72) Inventors: Wei-Ting Chen, Tainan (TW); Chung-Hao Tsai, Changhua County (TW); Chen-Hua Yu, Hsinchu (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/134,971

(22) Filed: Sep. 19, 2018

(65) Prior Publication Data
US 2020/0091063 A1 Mar. 19, 2020

(51) Int. Cl.
| | |
|---|---|
| *H01L 23/528* | (2006.01) |
| *H01L 23/522* | (2006.01) |
| *H01L 23/48* | (2006.01) |
| *H01L 25/16* | (2006.01) |
| *H01L 23/00* | (2006.01) |
| *H01L 21/56* | (2006.01) |

(52) U.S. Cl.
CPC ............ *H01L 23/528* (2013.01); *H01L 21/56* (2013.01); *H01L 23/481* (2013.01); *H01L 23/5223* (2013.01); *H01L 24/13* (2013.01); *H01L 24/81* (2013.01); *H01L 25/162* (2013.01); *H01L 2224/13147* (2013.01); *H01L 2224/81895* (2013.01)

(58) Field of Classification Search
CPC ... H01L 23/528; H01L 23/5223; H01L 24/81; H01L 24/13; H01L 21/56; H01L 25/162; H01L 23/481; H01L 2224/13147; H01L 2224/81895
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |

(Continued)

*Primary Examiner* — Stephen W Smoot
*Assistant Examiner* — Vicki B. Booker
(74) *Attorney, Agent, or Firm* — JCIPRNET

(57) ABSTRACT

A semiconductor structure including at least one integrated circuit component is provided. The at least one integrated circuit component includes a first semiconductor substrate and a second semiconductor substrate electrically coupled to the first semiconductor substrate, wherein the first semiconductor substrate and the second semiconductor substrate are bonded through a first hybrid bonding interface, and at least one of the first semiconductor substrate or the second semiconductor substrate includes at least one first embedded capacitor.

20 Claims, 24 Drawing Sheets

(56) References Cited

U.S. PATENT DOCUMENTS

| | | |
|---|---|---|
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,831,148 B2 * | 11/2017 | Yu .......................... H01L 24/98 |
| 2003/0128497 A1 * | 7/2003 | Allen ...................... H01G 4/06 361/306.3 |
| 2011/0101537 A1 * | 5/2011 | Barth ................ H01L 21/76898 257/774 |
| 2014/0035158 A1 * | 2/2014 | Chang .................. H01L 23/481 257/774 |
| 2015/0021785 A1 * | 1/2015 | Lin ..................... H01L 25/0657 257/774 |

* cited by examiner

SEMICONDUCTOR STRUCTURE, PACKAGE STRUCTURE, AND MANUFACTURING METHOD THEREOF

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
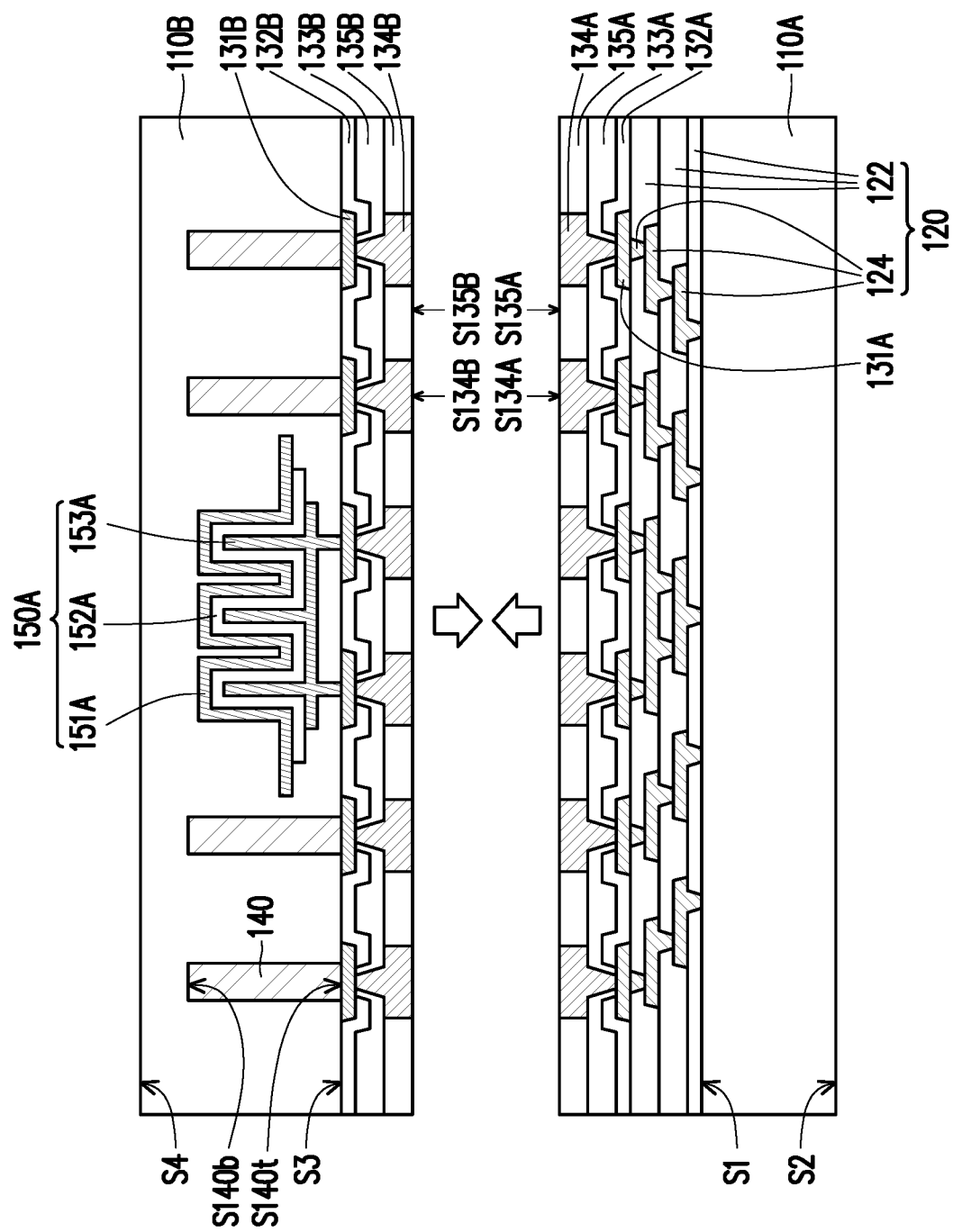
FIG. 1A to FIG. 1I are schematic cross sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," "fifth," "sixth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic cross sectional views of various stages in a manufacturing method of a package structure in accordance with some embodiments of the disclosure. The embodiments are intended to provide further explanations but are not used to limit the scope of the disclosure. In some embodiments, the manufacturing method is part of a packaging process at a wafer level. For illustrative purposes, in FIG. 1A to FIG. 1D, one integrated circuit component 100A is shown to represent plural integrated circuit components of a wafer, and in FIG. 1E to FIG. 1I, a package structure 10 including only one integrated circuit component 100A are shown to represent a package structure obtained following the manufacturing method, for example. In other embodiments, two or more integrated circuit components 100A are shown to represent plural integrated circuit components of the wafer or included in the (semiconductor) package structure, and two or more package structures 10 are shown to represent plural (semiconductor) package structures obtained following the (semiconductor) manufacturing method, the disclosure is not limited thereto.

Referring to FIG. 1A, in some embodiments, a semiconductor substrate 110A and a semiconductor substrate 110B are provided. In certain embodiments, the semiconductor substrate 110A includes an interconnection structure 120, conductive pads 131A, a passivation layer 132A, a post-passivation layer 133A, conductive vias 134A, and a protection layer 135A.

In some embodiments, the material of the semiconductor substrate 110A may include a silicon substrate including active components (e.g., transistors such as N-type metal-oxide semiconductor (NMOS) and/or P-type metal-oxide semiconductor (PMOS) devices, memories, or the like), passive components (e.g., resistors, capacitors, inductors or the like) or combinations thereof. In an alternative embodiment, the semiconductor substrate 110A may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In some embodiments, the semiconductor substrate 110A has a top surface S1 and a bottom surface S2 opposite to the top surface S1, and the interconnection structure 120 is formed on the top surface S1 of the semiconductor substrate 110A. In certain embodiments, the interconnection structure 120 may include one or more inter-dielectric layers 122 and one or more patterned conductive layers 124 stacked alternately. For example, the inter-dielectric layers 122 may be silicon oxide layers, silicon nitride layers, silicon oxy-nitride layers, or dielectric layers formed by other suitable dielectric materials, and the inter-dielectric layers 122 may be formed by deposition or the like. For example, the patterned conductive layers 124 may be patterned copper layers or other suitable patterned metal layers, and the patterned conductive layers 124 may be formed by electroplating or deposition. However, the disclosure is not limited thereto. In some embodiments, the patterned conductive layers 124 may be formed by dual-damascene method. The numbers of the layers of the inter-dielectric layers 122 and the patterned conductive layers 124 may be less than or more than what is depicted in FIG. 1A, and may be designated based on the demand and/or design layout; the disclosure is not specifically limited thereto.

In some embodiments, the conductive pads 131A are formed on and electrically connected to (or saying, electrically coupled to) the interconnection structure 120, the passivation layer 132A is formed on the conductive pads 131A and has openings partially exposing the conductive pads 131A, the post-passivation layer 133A is formed on the passivation layer 132A and has openings partially exposing the conductive pads 131A, the conductive vias 134A are respectively formed on and connected to the conductive pads 131A exposed by the passivation layer 132A and the post-passivation layer 133A, and the protection layer 135A covers the post-passivation layer 133A and at least wraps sidewalls of the conductive vias 134A. For example, as shown in FIG. 1A, top surfaces S134A of the conductive vias 134A are exposed by a top surface S135A of the protection layer 135A. In some embodiments, the top surfaces S134A of the conductive vias 134A are substantially coplanar to the top surface S135A of the protection layer 135A; and thus, there is a high degree of coplanarity between the top surfaces S134A of the conductive vias 134A and the top surface S135A of the protection layer 135A. Due to the high degree of coplanarity and flatness, the formation of the later-formed layer(s) is beneficial.

In some embodiments, the conductive pads 131A may be aluminum pads, copper pads or other suitable metal pads. In some embodiments, the passivation layer 132A, the post-passivation layer 133A, and the protection layer 135A may be a silicon oxide layer, a silicon nitride layer, a silicon oxy-nitride layer or a dielectric layer formed by other suitable dielectric materials. In some alternative embodiments, the passivation layer 132A, the post-passivation layer 133A, and the protection layer 135A may be a polyimide (PI) layer, a polybenzoxazole (PBO) layer, or a dielectric layer formed by other suitable polymers. It is noted that the formation of the post-passivation layer 133A is optional in some alternative embodiments. In one embodiment, the materials of the passivation layer 132A, the post-passivation layer 133A, and the protection layer 135A may be the same. In an alternative embodiment, the materials of the passivation layer 132A, the post-passivation layer 133A, and the protection layer 135A may be different. In some embodiments, the connecting vias 134A may be copper pillars, copper alloy pillar or other suitable metal pillars. The numbers of the conductive pads 131A and the conductive vias 134A may be less than or more than what is depicted in FIG. 1A, and may be designated based on the demand and/or design layout; the disclosure is not specifically limited thereto.

In some embodiments, the semiconductor substrate 110B includes conductive pads 131B, a passivation layer 132B, a post-passivation layer 133B, conductive vias 134B, and a protection layer 135B. However, the disclosure is not limited thereto; in alternative embodiments, the semiconductor substrate 110B may further include an interconnection structure similar to the interconnection structure 120.

In some embodiments, the material of the semiconductor substrate 110B may include a silicon substrate including active components (e.g., transistors such as N-type metal-oxide semiconductor (NMOS) and/or P-type metal-oxide semiconductor (PMOS) devices, memories, or the like), passive components (e.g., resistors, capacitors, inductors or the like) or combinations thereof. In an alternative embodiment, the semiconductor substrate 110B may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto. In one embodiment, the semiconductor substrate 110A may be the same as the semiconductor substrate 110B. In one embodiment, the semiconductor substrate 110A may be different from the semiconductor substrate 110B.

For example, as shown in FIG. 1A, the semiconductor substrate 110B includes at least one passive devices (e.g. capacitor 150A) embedded therein. In some embodiments, the capacitor 150A includes a conductive layer 151A, a conductive layer 153A, and a dielectric layer 152A sandwiched therebetween. In one embodiment, the capacitor 150A may be a trench capacitor or a deep trench capacitor. In one embodiment, the capacitor 150A may be a metal-insulator-metal (MIM) capacitor or a metal-oxide-metal (MOM) capacitor. In some embodiments, a capacitance density of the capacitor 150A is greater than or substantially equal to 100 $nF/mm^2$. Due to the capacitor 150A, the power integrity and system performance of the integrated circuit component 100A are improved. The numbers of the capacitor 150A may be one or more than one, and may be designated based on the demand and/or design layout; the disclosure is not limited to what is depicted in FIG. 1A. However, the disclosure is not limited thereto. In an alternative embodiment, the capacitor 150A may be included in the semiconductor substrate 110A, instead. In a further alternative embodiment, both of the semiconductor substrate 110A and the semiconductor substrate 110B may include at least one capacitor 150A.

In some embodiments, the semiconductor substrate 110B has a top surface S3 and a bottom surface S4 opposite to the top surface S3. As shown in FIG. 1A, for example, the conductive pads 131B are formed on the top surface S3 of the semiconductor substrate 110B and electrically connected to the capacitor 150A, the passivation layer 132B is formed on the conductive pads 131B and has openings exposing the conductive pads 131B, the post-passivation layer 133B is formed on the passivation layer 132B and has openings exposing the conductive pads 131B, the conductive vias 134B are respectively formed on and connected to the conductive pads 131B exposed by the passivation layer 132B and the post-passivation layer 133B, and the protection layer 135B covers the post-passivation layer 133B and at least wraps sidewalls of the conductive vias 134B. For example, as shown in FIG. 1A, top surfaces S134B of the conductive vias 134B are exposed by a top surface S135B of the protection layer 135B. In some embodiments, the top surfaces S134B of the conductive vias 134B are substantially coplanar to the top surface S135B of the protection layer 135B; and thus, there is a high degree of coplanarity between the top surfaces S134B of the conductive vias 134B and the top surface S135B of the protection layer 135B. Due to the high degree of coplanarity and flatness, the formation of the later-formed layer(s) is beneficial.

In some embodiments, the conductive pads 131B may be aluminum pads, copper pads or other suitable metal pads. In some embodiments, the passivation layer 132B, the post-passivation layer 133B, and the protection layer 135E may be a silicon oxide layer, a silicon nitride layer, a silicon oxy-nitride layer or a dielectric layer formed by other suitable dielectric materials. In some alternative embodiments, the passivation layer 132B, the post-passivation layer 133B, and the protection layer 135B may be a polyimide (PI) layer, a polybenzoxazole (PBO) layer, or a dielectric layer formed by other suitable polymers. It is noted that the formation of the post-passivation layer 133B is optional in some alternative embodiments. In one embodiment, the materials of the passivation layer 132B, the post-passivation layer 133B, and the protection layer 135B may be the same. In an alternative embodiment, the materials of the passivation layer 132B, the post-passivation layer 133B, and the protection layer 135B may be different. In some embodiments, the connecting vias 134B may be copper pillars, copper alloy pillar or other suitable metal pillars. The numbers of the conductive pads 131E and the conductive vias 134B may be less than or more than what is depicted in FIG. 1A, and may be designated based on the demand and/or design layout; the disclosure is not specifically limited thereto. In some embodiments, the materials of the conductive pads 131B, the passivation layer 132B, the post-passivation layer 133B, the conductive vias 134B, and the protection layer 135B may be the same or different from the materials of the conductive pads 131A, the passivation layer 132A, the post-passivation layer 133A, the conductive vias 134A, and the protection layer 135A, the disclosure is not limited thereto.

In some embodiments, the semiconductor substrate 110B includes through silicon vias (TSVs) 140 embedded therein and electrically connected to the conductive pads 131B. As shown in FIG. 1A, top surfaces S140t of the TSVs 140 are substantially coplanar to the top surface S3 of the semiconductor substrate 110B, and are physically connected to the conductive pads 131B. In some embodiments, a material of the TSVs 140 may be copper, copper alloy, or other suitable metal material. The number of the TSVs 140 can be selected based on demand and are not limited in the disclosure.

Figure 1B:
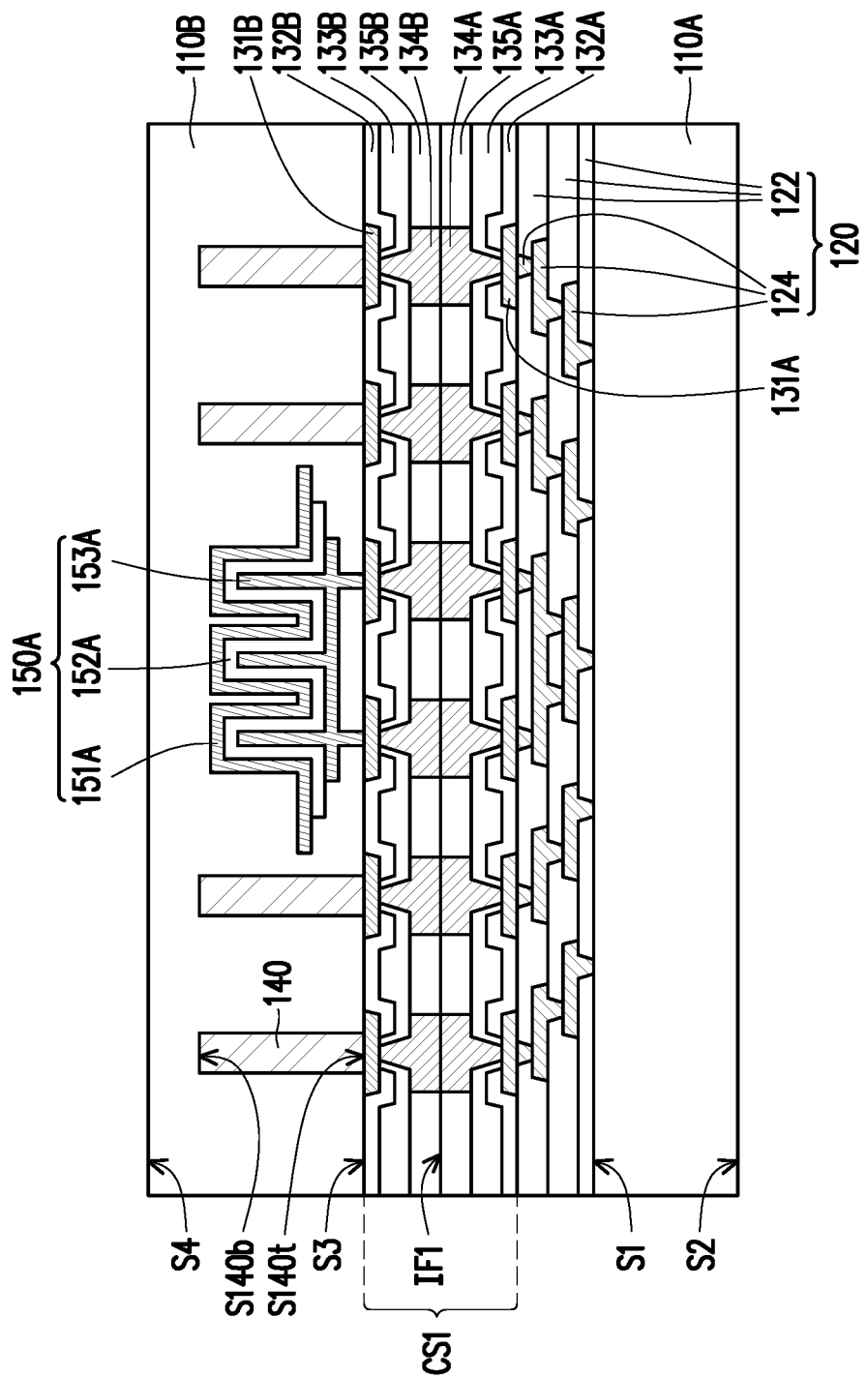

Referring to FIG. 1A and FIG. 1B together, in some embodiments, the semiconductor substrate 110B is picked and placed on the semiconductor substrate 110A, and is bonded to the semiconductor substrate 110A by hybrid bonding. As shown in FIG. 1A and FIG. 1B, in certain embodiments, the top surface S1 of the semiconductor substrate 110A is facing towards the top surface S3 of the semiconductor substrate 110B, and the conductive vias 134A are respectively prop against the conductive vias 134B. In other words, for example, the top surfaces S134A of the conductive vias 134A are aligned with the top surfaces S134B of the conductive vias 134B, and the top surface S135A of the protection layer 135A is aligned with the top surface S135B of the protection layer 135B. Through the conductive vias 134A, the conductive vias 134B, the protection layer 135A, and the protection layer 135B, the semiconductor substrate 110A and the semiconductor substrate 110B are bonded to each other by hybrid bonding. For example, the hybrid bonding process may include hydrophilic fusion bonding process or hydrophobic fusion bonding process. In one embodiment, a hydrophilic fusion bonding process is performed, where a workable bonding temperature approximately ranges from 150° C. to 400° C. and a workable bonding pressure is approximately greater than 2 J/m$^2$; however, the disclosure is not specifically limited thereto.

In some embodiments, as shown in FIG. 1B, after the hybrid bonding process, a bonding interface IF1 is between the semiconductor substrate 110A and the semiconductor substrate 110B, where the conductive vias 134A of the semiconductor substrate 110A and the conductive vias 134B of the semiconductor substrate 110B are physically connected and the protection layer 135A of the semiconductor substrate 110A and the protection layer 135B of the semiconductor substrate 110B are physically connected. In other words, the semiconductor substrate 110A and the semiconductor substrate 110B are located at two different sides of the bonding interface IF1, for example. In certain embodiments, as shown in FIG. 1B, the semiconductor substrate 110A and the semiconductor substrate 110B are electrically connected to each other through the conductive vias 134A of the semiconductor substrate 110A and the conductive vias 134B of the semiconductor substrate 110B. The conductive vias 134A and the conductive vias 134B are referred to as hybrid bonding structures. In addition, the conductive pads 131A/131B, the passivation layers 132A/132B, the post-passivation layers 133A/133B, the conductive vias 134A/134B and the protection layers 135A/135B are together referred to as a circuit structure CS1.

Figure 1C:
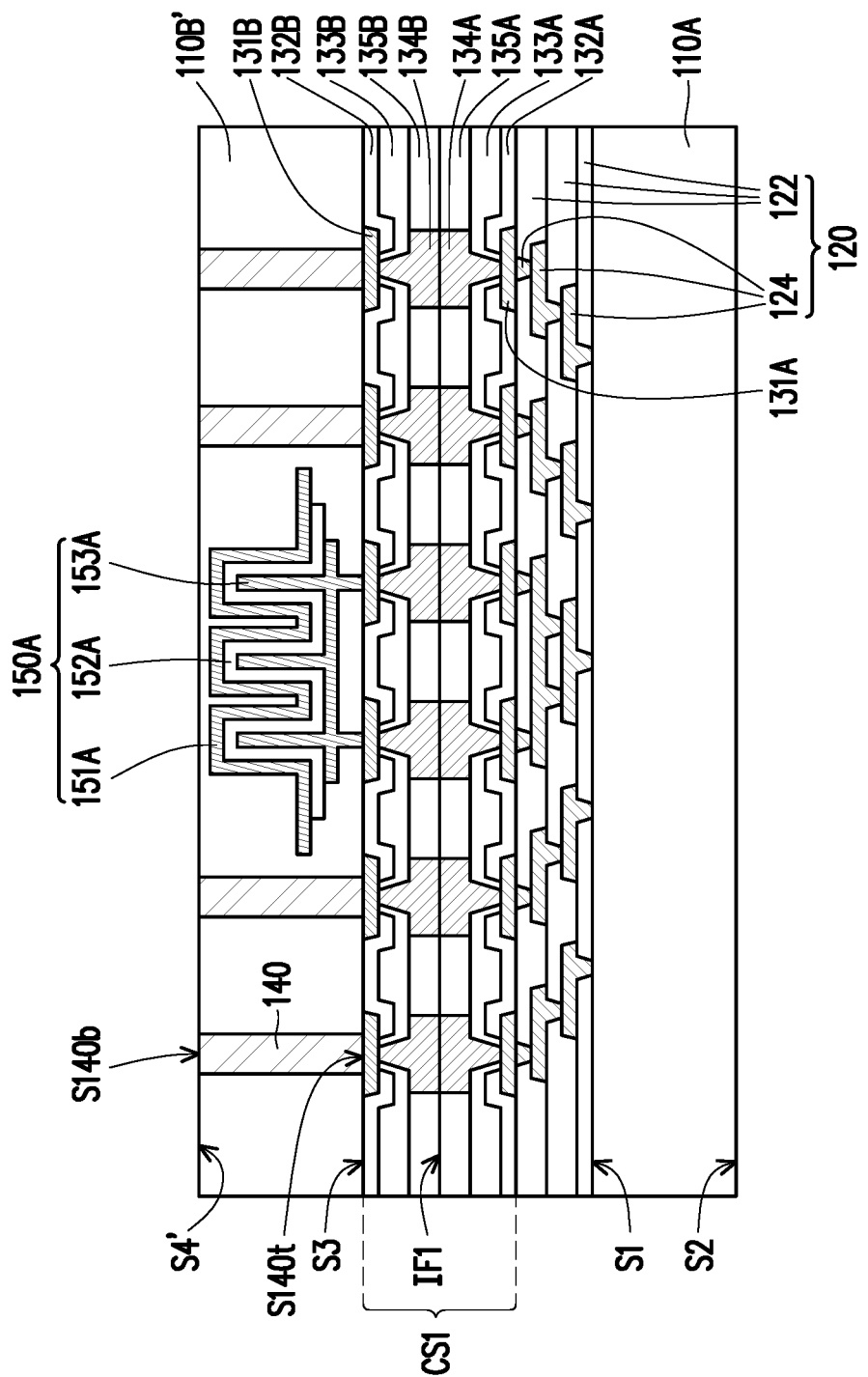

Referring to FIG. 1C, in some embodiments, a planarizing step is performed on the bottom surface S4 of the semiconductor substrate 110B to form a semiconductor substrate 110B' having a bottom surface S4' exposing bottom surfaces S140b of the TSVs 140. In some embodiments, the planarizing step may include a grinding process or a chemical mechanical polishing (CMP) process. After the planarizing step, a cleaning step may be optionally performed, for example to clean and remove the residue generated from the planarizing step. However, the disclosure is not limited thereto, and the planarizing step may be performed through any other suitable method. As shown in FIG. 1C, for example, the bottom surfaces S140b of the TSVs 140 is substantially levelled with the bottom surface S4' of the semiconductor substrate 110B'. In other words, the bottom surfaces S140b of the TSVs 140 are substantially coplanar to the bottom surface S4' of the semiconductor substrate 110B'. There is a high degree of coplanarity between the bottom surfaces S140b of the TSVs 140 and the bottom surface S4' of the semiconductor substrate 110B'. Due to the high degree of coplanarity and flatness, the formation of the later-formed layer(s) is beneficial.

Figure 1D:
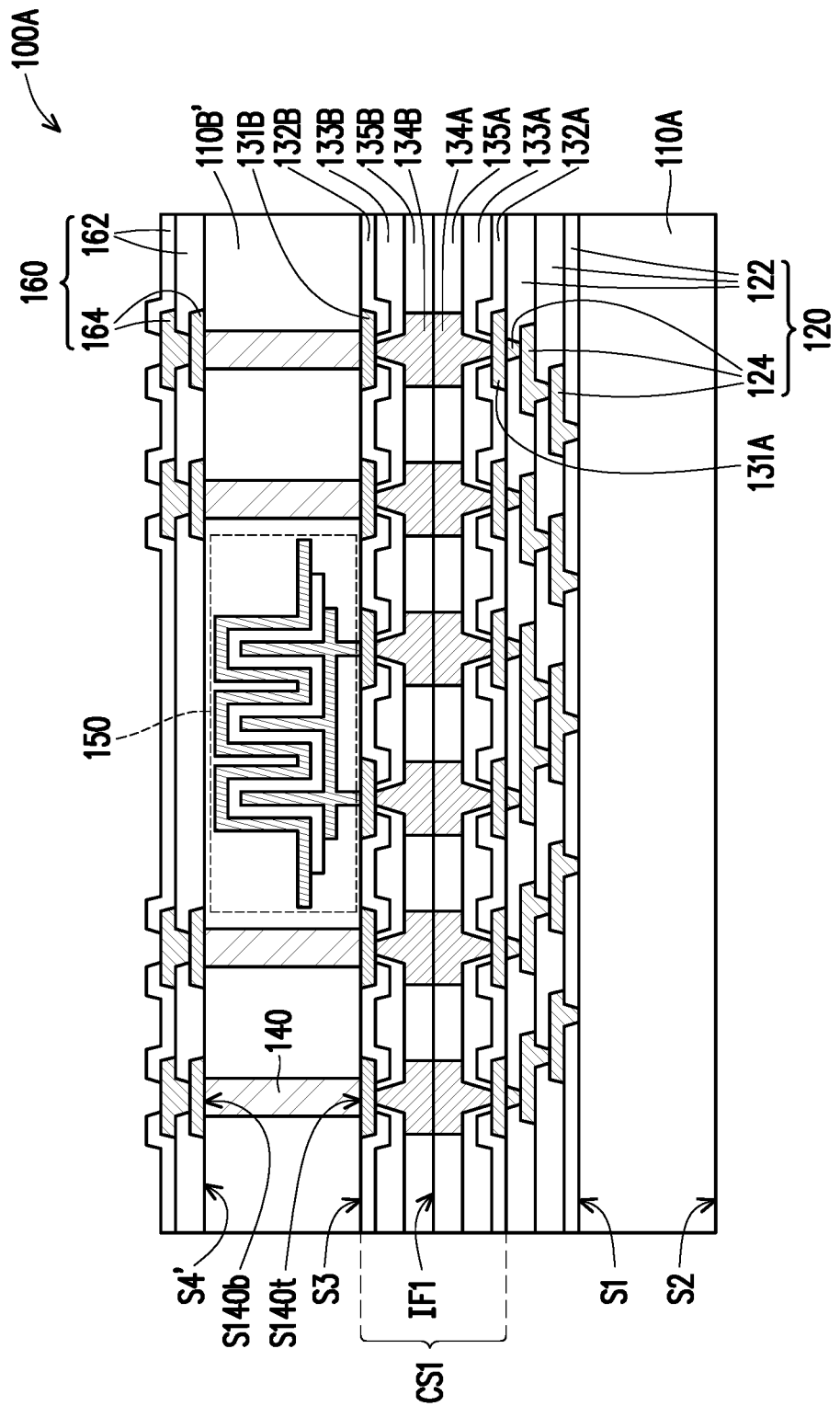

Referring to FIG. 1D, in some embodiments, one or more inter-dielectric layers 162 and one or more patterned conductive layers 164 are alternatively formed on the bottom surface S4' of the semiconductor substrate 110B' to form an integrated circuit component 100A. In other words, the inter-dielectric layers 162 and the patterned conductive layers 164 are stacked alternately. The inter-dielectric layers 162 and the patterned conductive layers 164 are together referred to as a circuit structure 160.

For examples, the inter-dielectric layers 162 may be silicon oxide layers, silicon nitride layers, silicon oxy-nitride layers, or dielectric layers formed by other suitable dielectric materials, and the inter-dielectric layers 162 may be formed by deposition or the like. For examples, the patterned conductive layers 164 may be patterned copper layers or other suitable patterned metal layers, and the patterned conductive layers 164 may be formed by electroplating or deposition. However, the disclosure is not limited thereto. In some embodiments, the patterned conductive layers 164 may be formed by dual-damascene method. The numbers of the layers of the inter-dielectric layers 162 and the patterned conductive layers 164 may be less than or more than what is depicted in FIG. 1D, and may be designated based on the demand and/or design layout; the disclosure is not specifically limited thereto.

In certain embodiments, the patterned conductive layers 164 are electrically connected to the TSVs 140 embedded in the semiconductor substrate 110B'. As shown in FIG. 1D, for example, a bottommost layer of the patterned conductive layers 164 is exposed by a lowest layer of the inter-dielectric layers 162 for connecting the TSVs 140, and a topmost layer of the patterned conductive layers 164 is exposed by a most upper layer of the inter-dielectric layers 162 for connecting later-formed component(s). The topmost layer of the patterned conductive layers 164 may include a plurality of conductive pads, and is referred to as top metal of the integrated circuit component 100A. Up to this, one single integrated circuit component 100A is manufactured.

In some embodiments, a dicing process (e.g., singulation) is performed to cut a plurality of the integrated circuit components 100A connected to each other into singulated and separate integrated circuit components 100A. In some embodiments, the dicing process may include mechanical sawing or laser cutting, however the disclosure is not limited thereto.

In an alternative embodiment, the bottommost layer of the patterned conductive layers 164 is exposed by the lowest layer of the inter-dielectric layers 162 for connecting the TSVs 140, and the topmost layer of the patterned conductive layers 164 is completely covered by the most upper layer of the inter-dielectric layers 162 for preventing damages due to transferring or transportation. In such embodiment, a grinding step may be required to at least partially remove the most upper layer of the inter-dielectric layers 162 and expose the topmost layer of the patterned conductive layers 164 for connecting later-formed component(s).

Figure 1E:
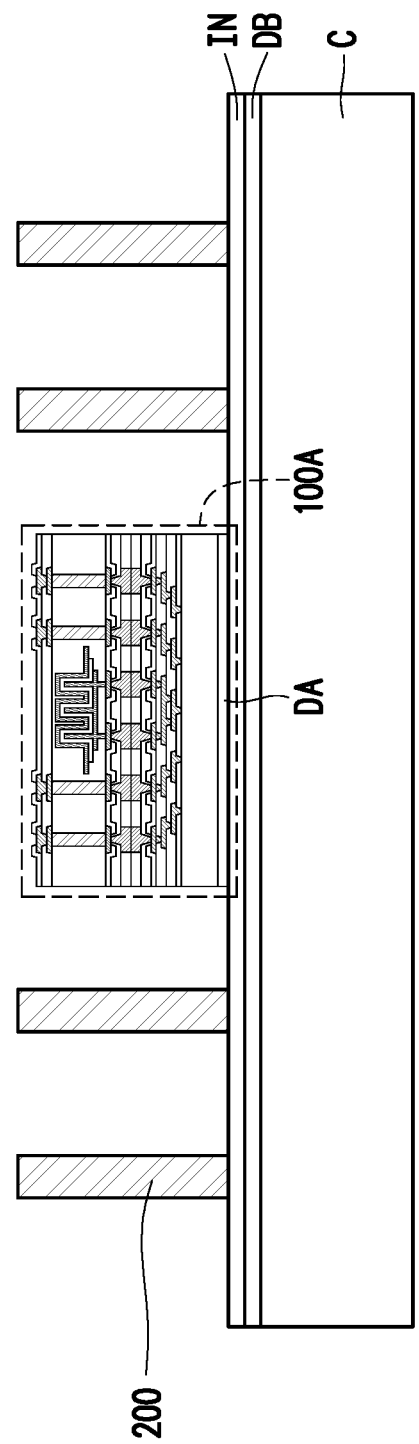

Referring to FIG. 1E, in some embodiments, a carrier C having a de-bonding layer DB and an insulating layer IN formed thereon is provided. In some embodiments, the de-bonding layer DB is between the carrier C and the insulating layer IN. In some embodiments, the carrier C is a glass substrate, the de-bonding layer DB is a light-to-heat conversion (LTHC) release layer formed on the glass substrate, and the insulating layer IN is a polybenzoxazole (PBO) layer formed on the de-bonding layer DB, for example. It is noted that the formation of the insulating layer IN is optional in some alternative embodiments. It may also be noted that materials for the carrier C, the de-bonding layer DB, and the insulating layer IN are not limited to what are disclosed herein in accordance with the disclosure.

In some embodiments, after the carrier C having the de-bonding layer DB and the insulating layer IN formed thereon is provided, a plurality of conductive pillars 200 are formed on the insulating layer IN. In some embodiments, the conductive pillars 200 are formed over the carrier C (e.g., directly on the insulating layer IN) by photolithography, plating, and photoresist stripping process. In some alternative embodiments, the conductive pillars 200 are pre-fabricated through other processes and are mounted over the carrier C. For example, the conductive pillars 200 include copper posts or other metallic posts.

Continued on FIG. 1E, in some embodiments, the integrated circuit component 100A depicted in FIG. 1D may be picked-up and placed on the insulating layer IN carried by the carrier C. In some embodiments, the integrated circuit component 100A is attached or adhered on the insulating layer IN through a die attach film DA, an adhesion paste or the like. In some embodiments, the integrated circuit component 100A may have a thickness less than a height of the conductive pillars 200, as shown in FIG. 1E. However, the disclosure is not limited thereto. In an alternative embodiment, the thickness of the integrated circuit component 100A may be greater than or substantially equal to the height of the conductive pillars 200. As shown in FIG. 1E, the integrated circuit component 100A may be picked-up and placed on the insulating layer IN after the formation of the conductive pillars 200. However, the disclosure is not limited thereto. In an alternative embodiment, the integrated circuit component 100A may be picked-up and placed on the insulating layer IN before the formation of the conductive pillars 200. The numbers of the integrated circuit component 100A and the conductive pillars 200 may be designated based on the demand and/or design layout, and is not limited to the disclosure.

Figure 1F:
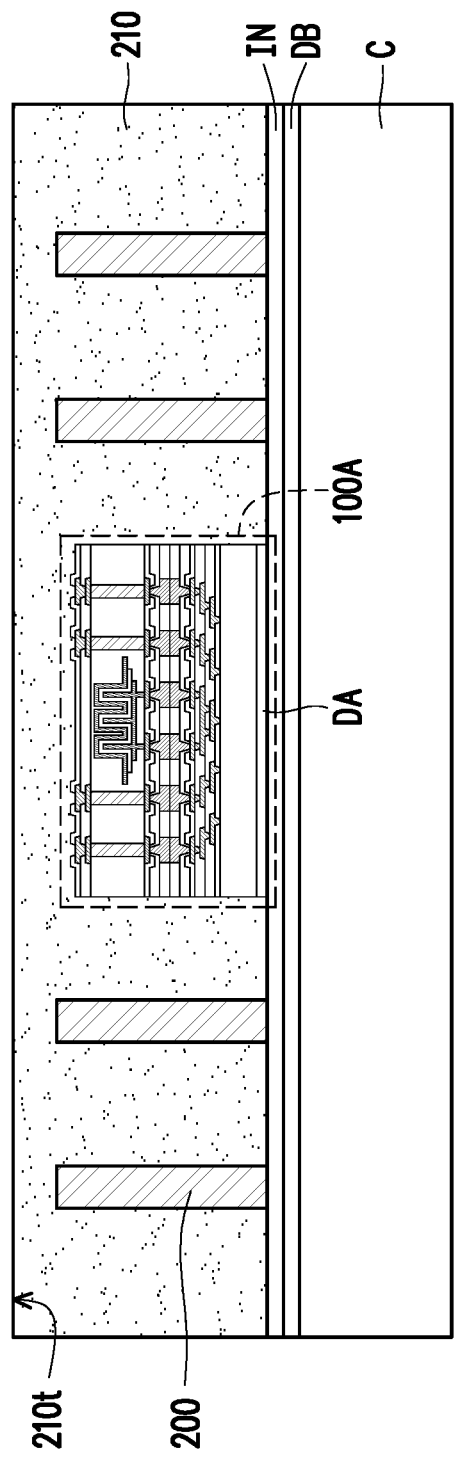

Referring to FIG. 1F, an insulating encapsulation 210 is formed over the carrier C (e.g., on the insulating layer IN) to encapsulate the integrated circuit component 100A and the conductive pillars 200. In other words, the integrated circuit component 100A and the conductive pillars 200 are covered by and embedded in the insulating encapsulation 210. In other words, for example, the integrated circuit component 100A and the conductive pillars 200 are not accessibly revealed by a top surface 210t of the insulating encapsulation 210. In some embodiments, the insulating encapsulation 210 is a molding compound formed by a molding process, and the material of the insulating encapsulation 210 may include epoxy or other suitable resins. For example, the insulating encapsulation 210 may be epoxy resin containing chemical filler.

Figure 1G:
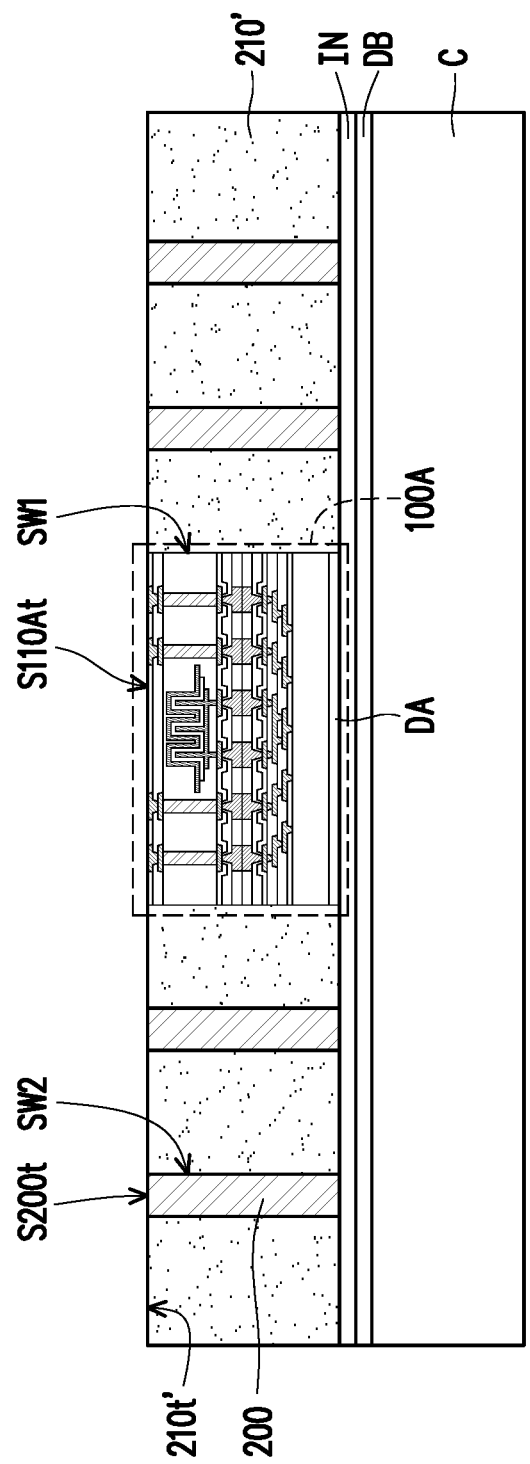

Referring to FIG. 1F and FIG. 1G, in some embodiments, the insulating encapsulation 210, the conductive pillars 200 and the integrated circuit component 100A are planarized until a surface S110At of the integrated circuit component 100A (e.g., the top surfaces of the topmost layer of the patterned conductive layers 164 and the most upper layer of the inter-dielectric layers 162) and top surfaces S200t of the conductive pillars 200 are exposed. After the insulating encapsulation 210 is planarized, a planarized insulating encapsulation 210' is formed over the carrier C (e.g., on the insulating layer IN), and the integrated circuit component 100A and the conductive pillars 200 are accessibly revealed by a top surface 210t' of the planarized insulating encapsulation 210'.

During the planarized process of the insulating encapsulation 210 (shown in FIG. 1G), the most upper layer of the inter-dielectric layers 162 and/or portions of the topmost layer of the patterned conductive layers 164 may be also planarized. In some embodiments, as shown in FIG. 1G, during the planarized process of the insulating encapsulation 210, the most upper layer of the inter-dielectric layers 162, and portions of the conductive pillars 200 are planarized also. In some embodiments, as shown in FIG. 1G, during the planarized process of the insulating encapsulation 210, the most upper layer of the inter-dielectric layers 162, portions of the topmost layer of the patterned conductive layers 164, and portions of the conductive pillars 200 are planarized also. The planarized insulating encapsulation 210' may be formed by mechanical grinding or CMP, for example. After the planarizing process, a cleaning step may be optionally performed, for example to clean and remove the residue generated from the planarizing step. However, the disclosure is not limited thereto, and the planarizing step may be performed through any other suitable method.

In some embodiments, as shown in FIG. 1G, the planarized insulating encapsulation 210' physically contacts a sidewall SW1 of the integrated circuit component 100A and sidewalls SW2 of the conductive pillars 200. In other words, the integrated circuit component 100A and the conductive pillars 200 are mostly embedded in the planarized insulating encapsulation 210' with only the top surface S110At of the integrated circuit component 100A and top surface S200t of the conductive pillars 200 being accessibly exposed. In certain embodiments, the top surfaces of the most upper layer of the inter-dielectric layers 162 and the topmost layer of the patterned conductive layers 164 and the top surfaces S200t of the conductive pillars 200 are substantially levelled with a top surface 210t' of the planarized insulating encapsulation 210'. In other words, the top surface of the most upper layer of the inter-dielectric layers 162 and the topmost layer of the patterned conductive layers 164 and the top surfaces S200t of the conductive pillars 200 are substantially coplanar with the top surface 210t' of the planarized insulating encapsulation 210'. Due to the high degree of coplanarity and flatness between the planarized insulating encapsulation 210', the integrated circuit component 100A and the conductive pillars 200, the formation of the later-formed layer(s) is beneficial.

Figure 1H:
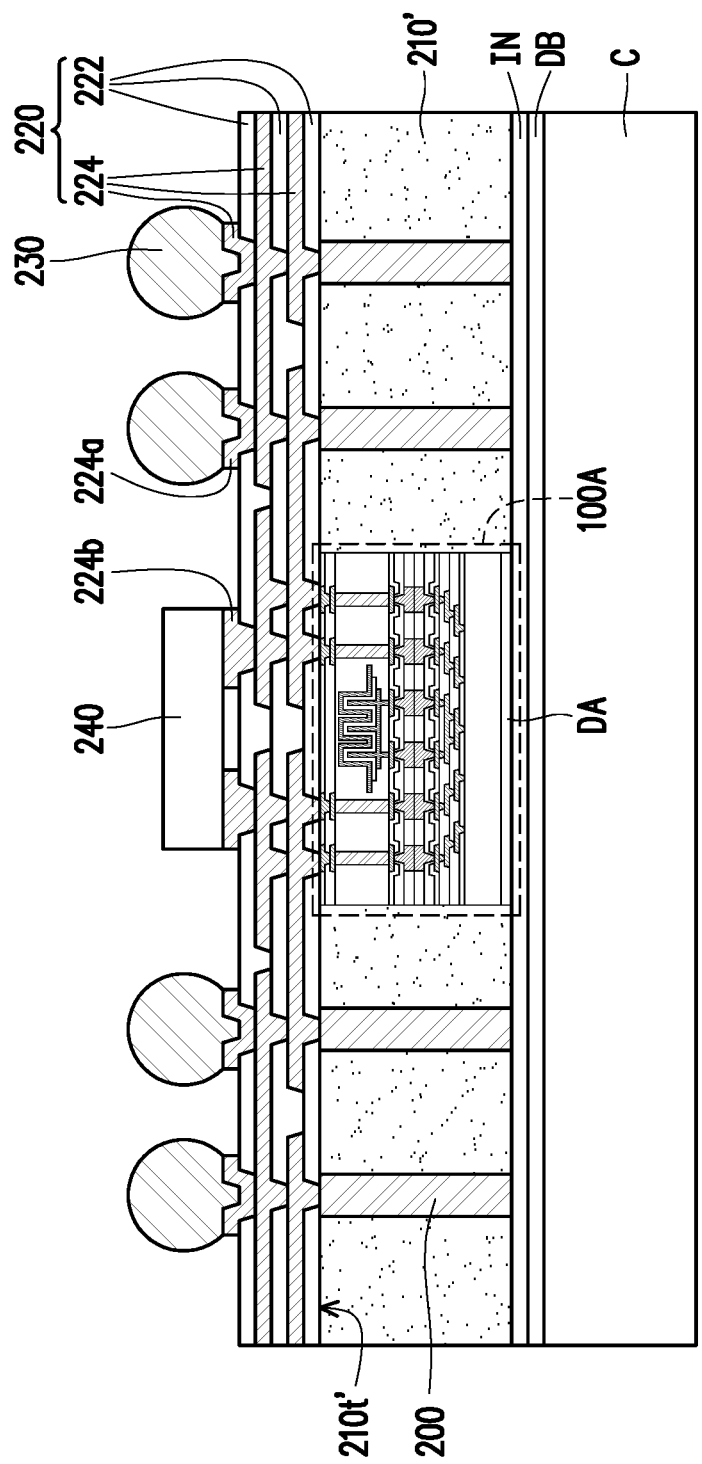

Referring to FIG. 1H, in some embodiments, after the planarized insulating encapsulation 210' is formed, a redistribution circuit structure 220 is formed on the planarized insulating encapsulation 210'. In some embodiments, the redistribution circuit structure 220 is formed on the top surface 210t' of the planarized insulating encapsulation 210', the top surfaces of the most upper layer of the inter-dielectric layers 162 and the topmost layer of the patterned conductive layers 164, and the top surfaces S200t of the conductive pillars 200. In certain embodiments, the redistribution circuit structure 220 is fabricated to electrically connect with one or more connectors underneath. Here, the afore-said connectors may be the topmost layer of the patterned conductive layers 164 exposed by the most upper layer of the inter-dielectric layers 162 and the conductive pillars 200 embedded in the planarized insulating encapsulation 210'. In other words, the redistribution circuit structure 220 is electrically connected to the exposed topmost layer of the patterned conductive layers 164 and the conductive pillars 200. The redistribution circuit structure 220 may be referred as a front-side redistribution layer of the integrated circuit component 100A.

Continued on FIG. 1H, in some embodiments, the redistribution circuit structure 220 includes a plurality of inter-dielectric layers 222 and a plurality of redistribution conductive layers 224 stacked alternately, and the redistribution conductive layers 224 are electrically connected to the exposed topmost layer of the patterned conductive layers 164 and the conductive pillars 200 embedded in the planarized insulating encapsulation 210'. As shown in FIG. 1H, in some embodiments, the top surface of the topmost layer of the patterned conductive layers 164 and the top surfaces S200t of the conductive pillars 200 are in contact with the redistribution circuit structure 220. In such embodiments, the top surface of the topmost layer of the patterned conductive layers 164 and the top surfaces S200t of the conductive pillars 200 are in contact with the bottommost one of the redistribution conductive layers 224. In some embodiments, the top surface of the topmost layer of the patterned conductive layers 164 and the top surfaces S200t of the conductive pillars 200 are partially covered by the bottommost inter-dielectric layer 222.

In some embodiments, the material of the redistribution conductive layers 224 includes aluminum, titanium, copper, nickel, tungsten, and/or alloys thereof, and the redistribution conductive layers 224 may be formed by electroplating or deposition. In some embodiments, the material of the inter-dielectric layers 222 includes polyimide, epoxy resin, acrylic resin, phenol resin, benzocyclobutene (BCB), polybenzoxazole (PBO), or any other suitable polymer-based dielectric material, and the inter-dielectric layers 222 may be formed by deposition. The numbers of the layers of the inter-dielectric layers 222 and the redistribution conductive layers 224 may be may be designated based on the demand and/or design layout, and is not specifically limited to the disclosure.

In certain embodiments, the topmost redistribution conductive layer 224 may include a plurality of conductive pads. In such embodiments, the above-mentioned conductive pads may include a plurality of under-ball metallurgy (UBM) patterns 224a for ball mount and/or a plurality of connection pads 224b for mounting of passive components. The numbers of the under-ball metallurgy patterns 224a and the number of the connection pads 224b are not limited in accordance with the disclosure. Continued on FIG. 1H, in some embodiments, after the redistribution circuit structure 220 is formed, a plurality of conductive balls 230 are placed on the under-ball metallurgy patterns 224a, and at least one passive component 240 is mounted on the connection pads 224b. In some embodiments, the conductive balls 230 may be placed on the under-ball metallurgy patterns 224a through ball placement process, and the passive components 240 may be mounted on the connection pads 224b through soldering process. However, the disclosure is not limited thereto.

In some embodiments, through the redistribution circuit structure 220 and the under-ball metallurgy patterns 224a, some of the conductive balls 230 are electrically connected to the integrated circuit component 100A. In some embodiments, through the redistribution circuit structure 220 and the under-ball metallurgy patterns 224a, some of the conductive balls 230 are electrically connected to the conductive pillars 200. In some embodiments, through the redistribution circuit structure 220, the under-ball metallurgy patterns 224a and the connection pads 224b, some of the conductive balls 230 are electrically connected to the passive component 240. In some embodiments, through the redistribution circuit structure 220 and the connection pads 224b, the passive component 240 is electrically connected to the integrated circuit component 100A. In certain embodiments, some of the conductive balls 230 may be electrically floated or grounded, the disclosure is not limited thereto.

Figure 1I:
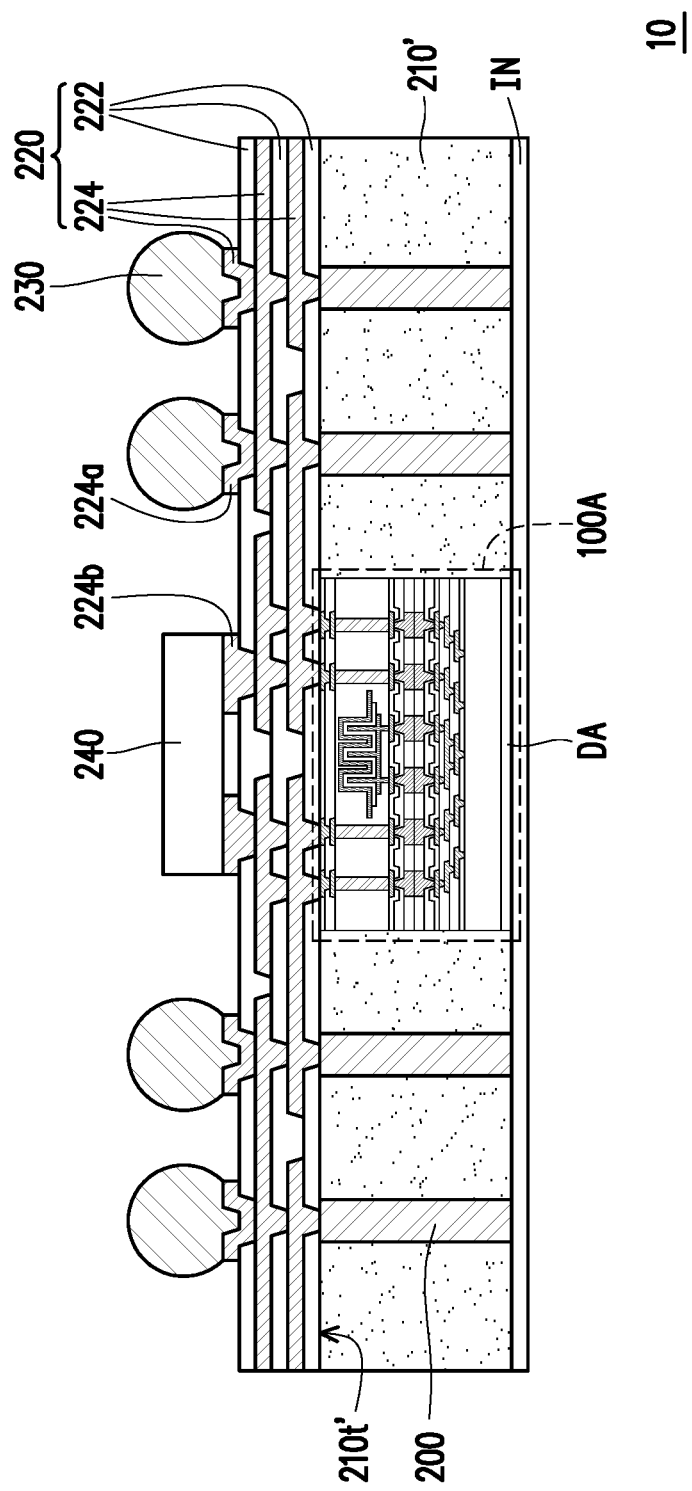

Referring to FIG. 1H and FIG. 1I, in some embodiments, after the redistribution circuit structure 220, the conductive balls 230 and the passive component 240 are formed, the de-bonding layer DB and the carrier C are de-bonded from the insulating layer IN to form a package structure 10. As shown in FIG. 1I, the insulating layer IN is easily separated from the carrier C due to the de-bonding layer DB carried by the carrier C. In embodiments where the de-bonding layer DB is the LTHC release layer, an UV laser irradiation may be utilized to facilitate peeling of the insulating layer IN from the carrier C. Up to here, the manufacture of the package structures 10 is completed.

During the de-bonding step, for example, the package structure 10 is flipped along with the carrier C, and a holding device (not shown) is adopted to secure the package structure 10 before de-bonding the carrier C and the de-bonding layer DB, where the conductive balls 230 are held by the holding device. For example, the holding device may be an adhesive tape, a carrier film or a suction pad. In some embodiments, prior to releasing the conductive balls 230 from the holding device, the carrier C is de-bonded and the dicing process is then performed to cut a wafer having a plurality of the packages structures 10 into individual and separated packages structures 10. In one embodiment, the dicing process is a wafer dicing process including mechanical blade sawing or laser cutting.

In some embodiments, the package structure 10 may be further bonded to an additional package including chips/dies or other electronic devices to form a package-on-package (POP) structure. For example, based on the demand, the package structure 10 may be further bonded to an additional package having chips/dies or other electronic devices to form the POP structure through the conductive pillars 200 exposed by openings formed in the insulating layer IN and/or other additional connectors. However, the disclosure is not limited thereto. In some embodiments, the insulating layer IN may be optionally removed.

In other alternative embodiments, the carrier C may be remained on and be a part of the package structure 10. For example, as the material of the carrier C is a reclaim silicon substrate or the like, the carrier C may serve as a heat dissipating element for the package structure 10. In such embodiments, the carrier C may further be used for warpage control.

Figure 2A:
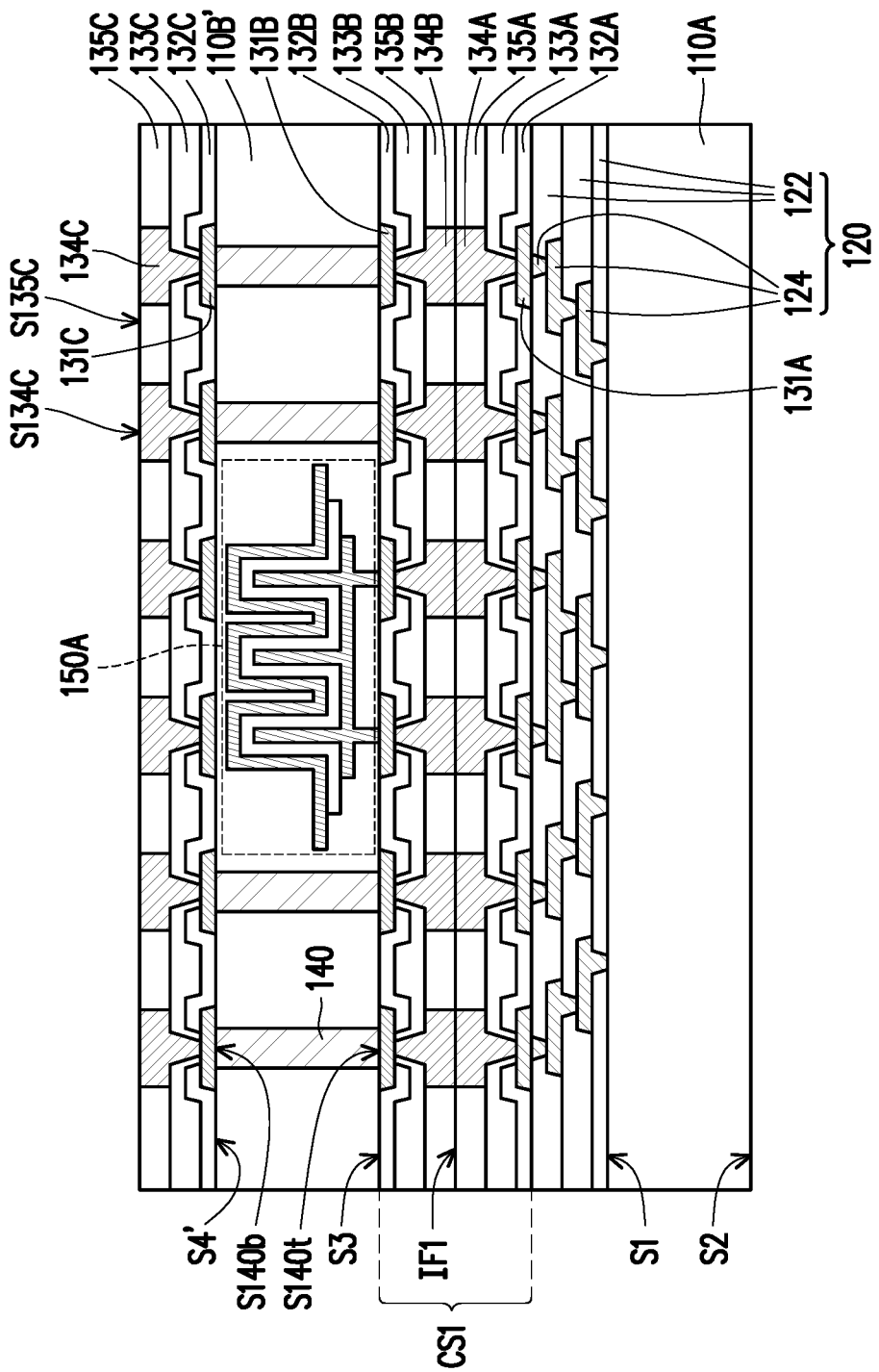
FIG. 2A to FIG. 2D are schematic cross sectional views of various stages in a manufacturing method of an integrated circuit component included a package structure in accordance with some embodiments of the disclosure.
Figure 2B:
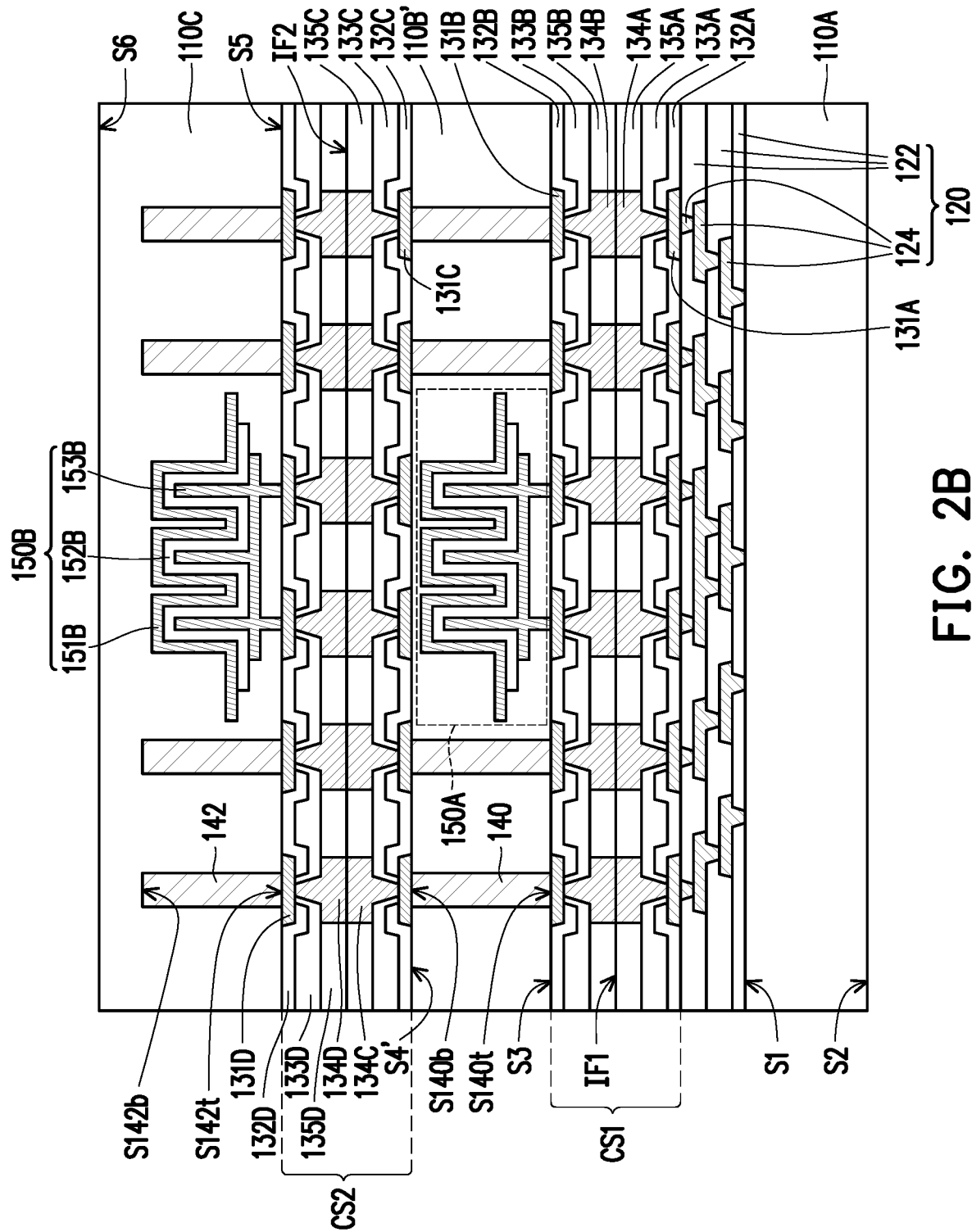
Figure 2C:
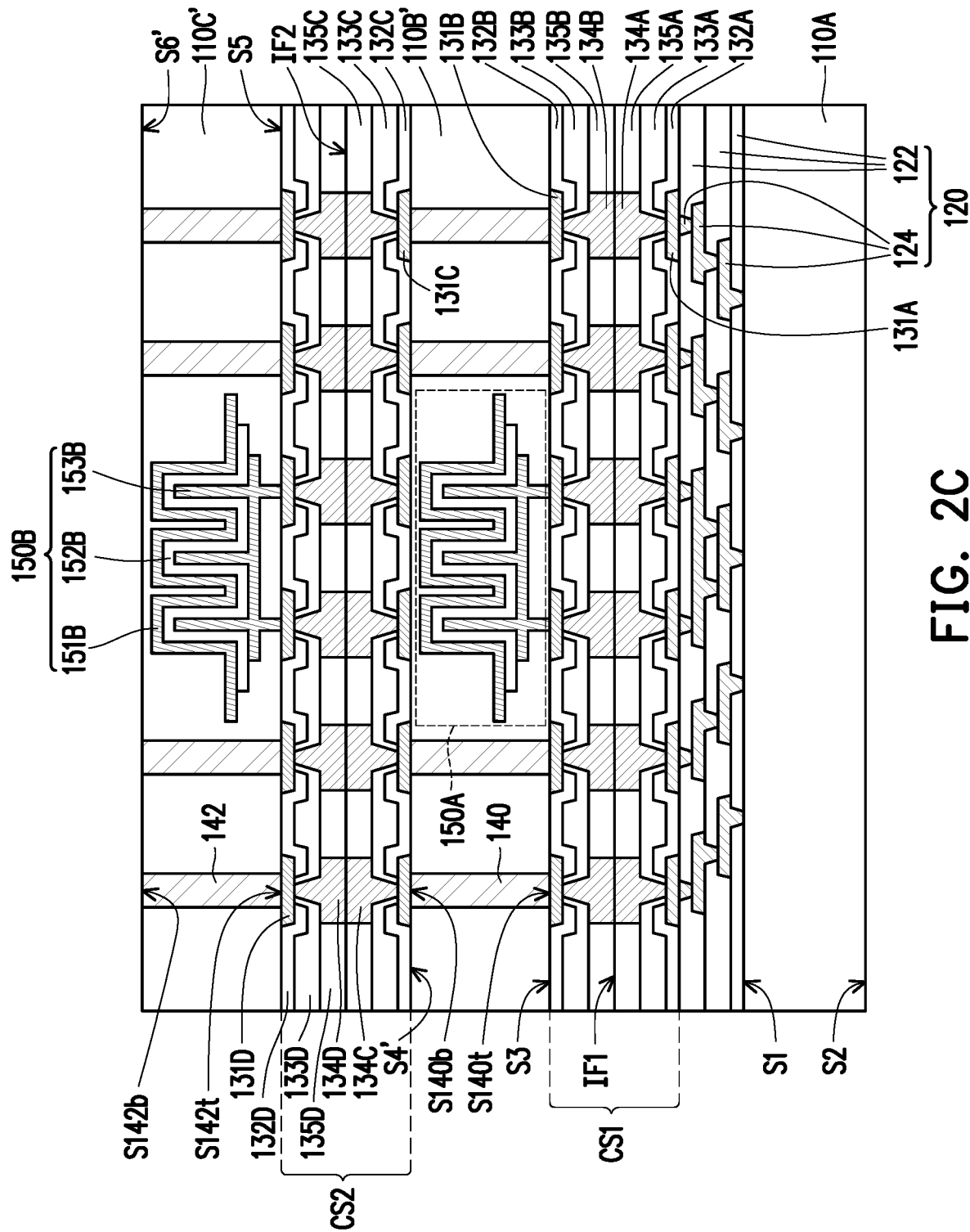
Figure 2D:
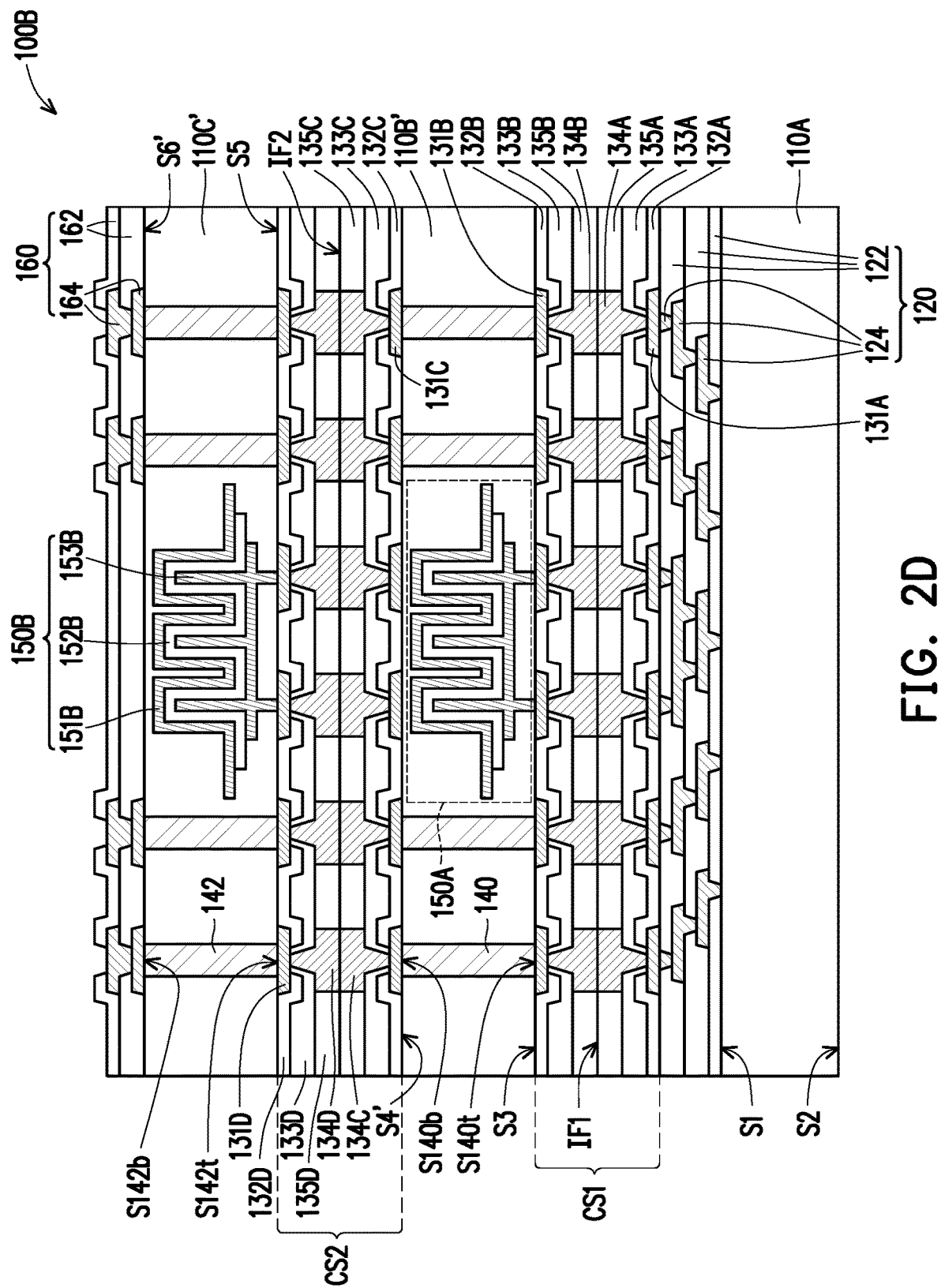
Figure 3A:
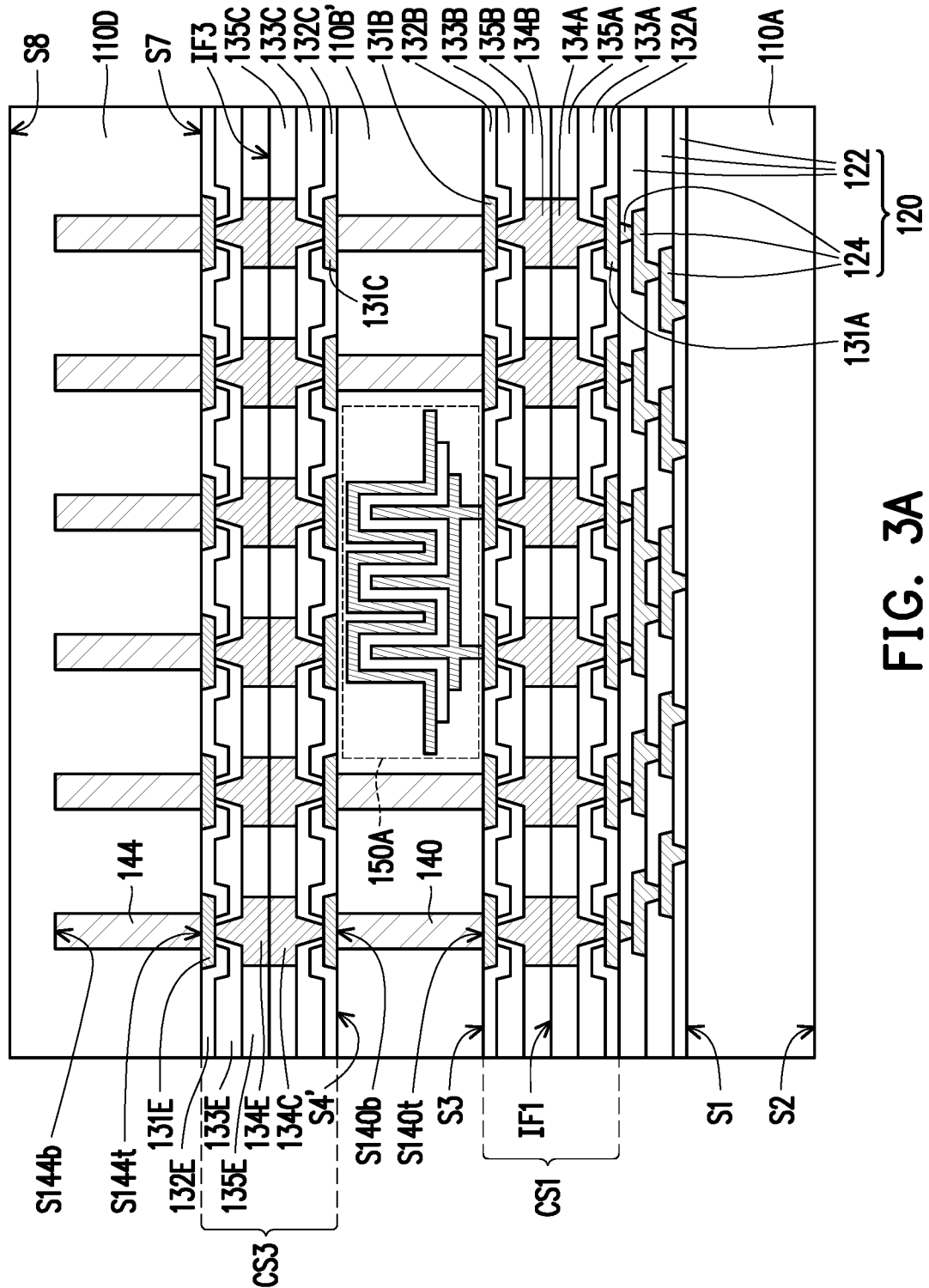
FIG. 3A to FIG. 3C are schematic cross sectional views of various stages in a manufacturing method of an integrated circuit component included a package structure in accordance with some embodiments of the disclosure.
Figure 4:
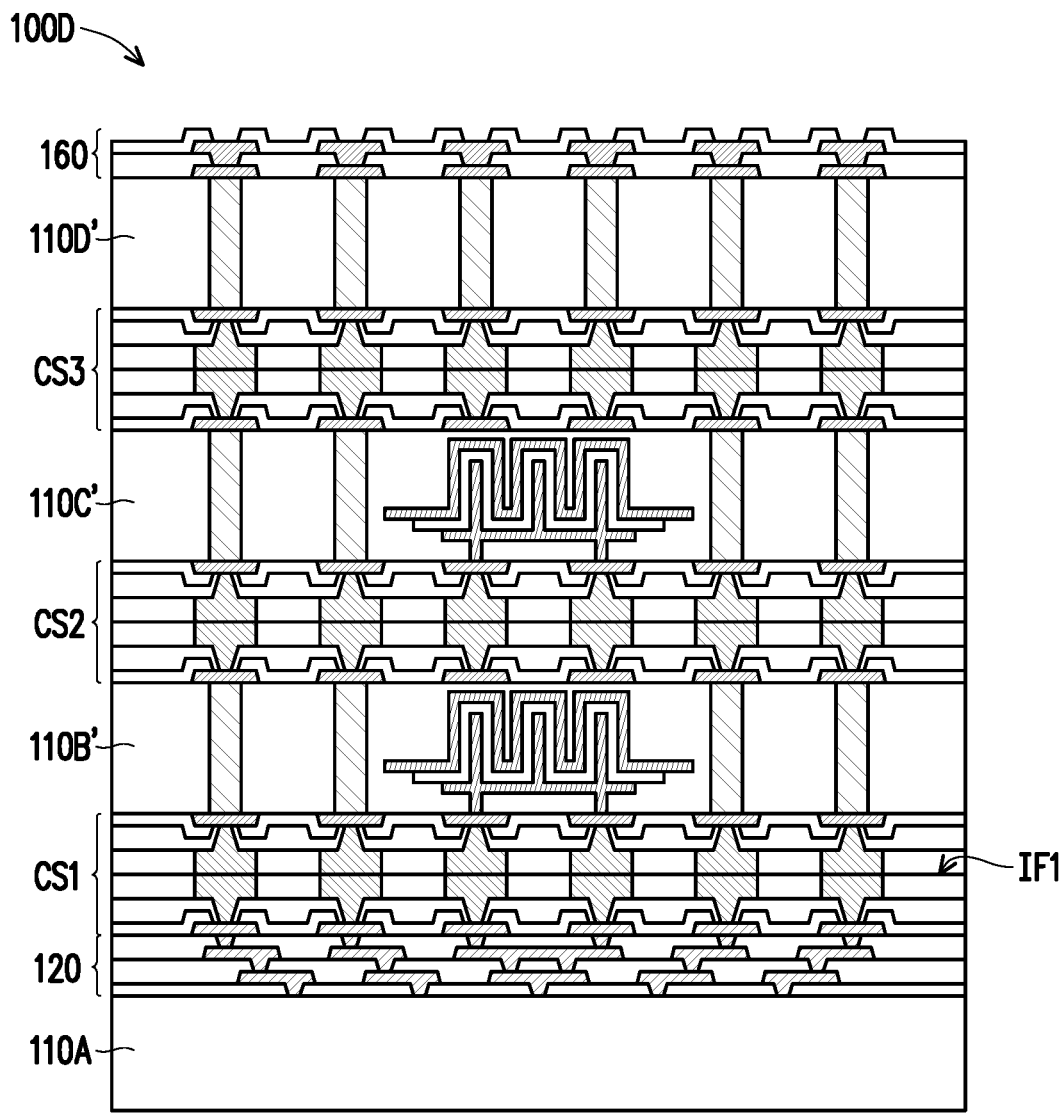
FIG. 4 is a schematic cross-sectional view of an integrated circuit component included a package structure in accordance with some embodiments of the disclosure.
Figure 5:
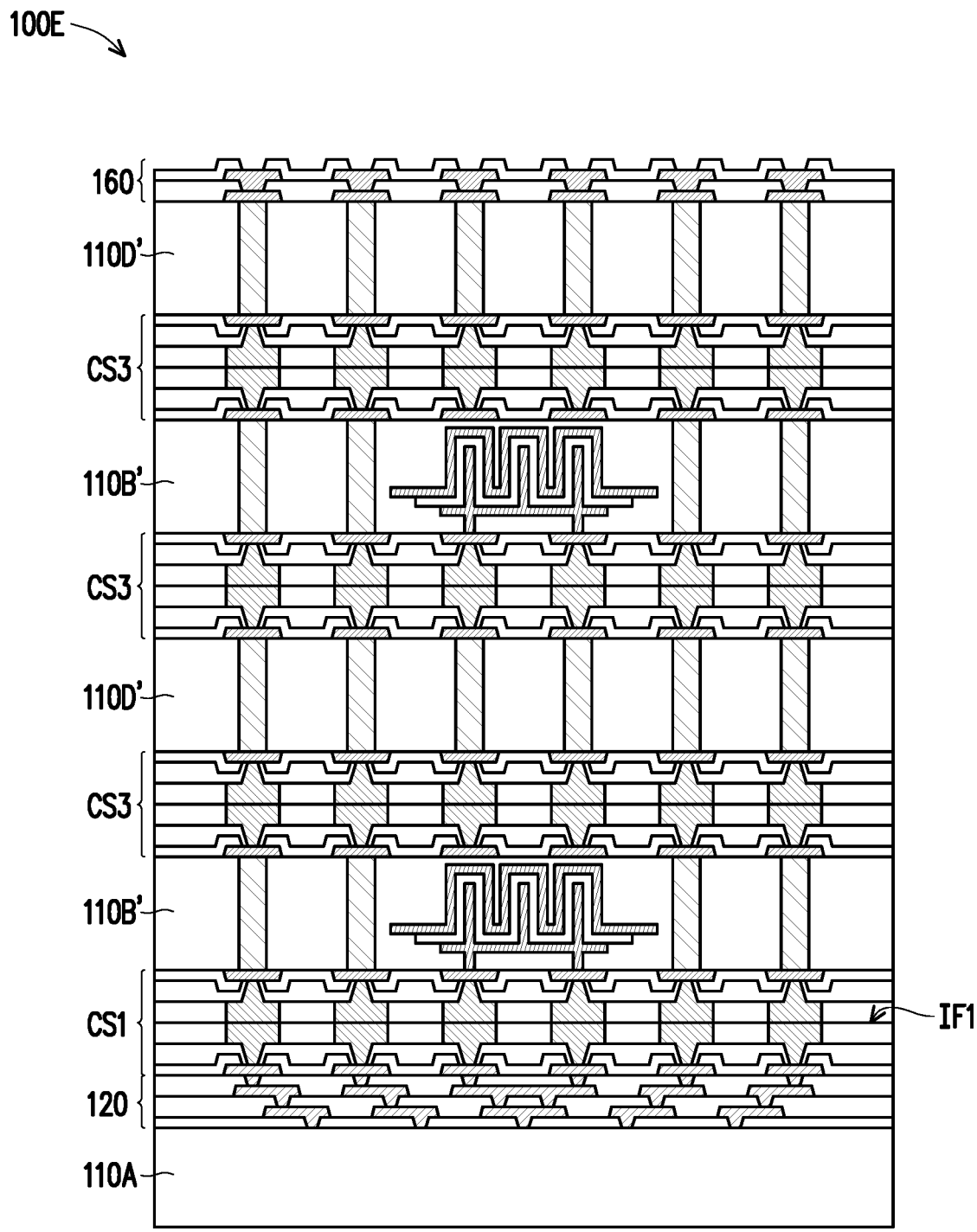
FIG. 5 is a schematic cross-sectional view of an integrated circuit component included a package structure in accordance with some embodiments of the disclosure.

In other embodiments, in the package structure 10, the integrated circuit component 100A may be replaced by an integrated circuit component 100B depicted in FIG. 2D, an integrated circuit component 100C depicted in FIG. 3D, an integrated circuit component 100D depicted in FIG. 4, or an integrated circuit component 100E depicted in FIG. 5, the disclose is not limited thereto. The detailed structures of the integrated circuit component 100B, the integrated circuit component 100C, the integrated circuit component 100D, and the integrated circuit component 100E is provided hereafter.

FIG. 2A to FIG. 2D are schematic cross sectional views of various stages in a manufacturing method of an integrated circuit component of a package structure in accordance with some embodiments of the disclosure. The elements similar to or substantially the same as the elements described previously will use the same reference numbers, and certain details or descriptions (e.g. formation methods, materials, and so on) of the same elements may not be repeated herein.

Referring to FIG. 2A, in some embodiments, conductive pads 131C are formed on the bottom surface S4' of the semiconductor substrate 110B' and electrically connected to the TSVs 140, a passivation layer 132C is formed on the conductive pads 131C and has openings exposing the conductive pads 131C, the post-passivation layer 133C is formed on the passivation layer 132C and has openings exposing the conductive pads 131C, the conductive vias 134C are respectively formed on and connected to the conductive pads 131C exposed by the passivation layer 132C and the post-passivation layer 133C, and the protection layer 135C covers the post-passivation layer 133C and at least wraps sidewalls of the conductive vias 134C, following the process as described in FIG. 1C. For example, as shown in FIG. 2A, top surfaces S134C of the conductive vias 134C are exposed by a top surface S135C of the protection layer 135C. In some embodiments, the top surfaces S134C of the conductive vias 134C are substantially coplanar to the top surface S135C of the protection layer 135C; and thus, there is a high degree of coplanarity between the top surfaces S134C of the conductive vias 134C and the top surface S135C of the protection layer 135C. Due to the high degree of coplanarity and flatness, the formation of the later-formed layer(s) is beneficial.

Referring to FIG. 2B, in some embodiments, a semiconductor substrate 110C is picked and placed on the semiconductor substrate 110B' and is boned to the semiconductor substrate 110B' by hybrid bonding. For example, the hybrid bonding process may include hydrophilic fusion bonding process or hydrophobic fusion bonding process. In one embodiment, a hydrophilic fusion bonding process is performed, where a workable bonding temperature approximately ranges from 150° C. to 400° C. and a workable bonding pressure is approximately greater than 2 $J/m^2$; however, the disclosure is not specifically limited thereto.

In some embodiments, the semiconductor substrate 110C includes conductive pads 131D, a passivation layer 132D, a post-passivation layer 133D, conductive vias 134D, a protection layer 135D, through silicon vias (TSVs) 142, and at least one capacitor 150B. However, the disclosure is not limited thereto; in alternative embodiments, the semiconductor substrate 110C may further include an interconnection structure similar to the interconnection structure 120.

In one embodiment, the semiconductor substrate 110C may be the same as the semiconductor substrate 110A and/or the semiconductor substrate 110B which may include active devices, passive devices, or combinations thereof, and thus the material thereof will not be repeated herein. For example, as shown in FIG. 2B, the semiconductor substrate 110C is similar to the semiconductor substrate 110B. However, the disclosure is not limited thereto; in one embodiment, the semiconductor substrate 110C may be different from the semiconductor substrate 110A and/or the semiconductor substrate 110B.

As shown in FIG. 2B, in some embodiments, the semiconductor substrate 110C includes the capacitor 150B embedded therein, where the capacitor 150B includes a conductive layer 151B, a conductive layer 153B, and a dielectric layer 152B sandwiched therebetween. In one embodiment, the capacitor 150B may be a trench capacitor or a deep trench capacitor. In one embodiment, the capacitor 150B may be a metal-insulator-metal (MIM) capacitor or a metal-oxide-metal (MOM) capacitor. In some embodiments, a capacitance density of the capacitor 150B is greater than or substantially equal to 100 nF/mm². The numbers of the capacitor 150B may be one or more than one, and may be designated based on the demand and/or design layout; the disclosure is not limited to what is depicted in FIG. 2B. The numbers of the conductive pads 131D and the conductive vias 134D may be less than or more than what is depicted in FIG. 2B, and may be designated based on the demand and/or design layout; the disclosure is not specifically limited thereto.

In some embodiments, the semiconductor substrate 110C has a top surface S5 and a bottom surface S6 opposite to the top surface S5. As shown in FIG. 2B, for example, the conductive pads 131D are formed on the top surface S5 of the semiconductor substrate 110C and electrically connected to the capacitor 150B, the passivation layer 132D is formed on the conductive pads 131D and has openings exposing the conductive pads 131D, the post-passivation layer 133D is formed on the passivation layer 132D and has openings exposing the conductive pads 131D, the conductive vias 134D are respectively formed on and connected to the conductive pads 131D exposed by the passivation layer 132D and the post-passivation layer 133D, and the protection layer 135D covers the post-passivation layer 133D and at least wraps sidewalls of the conductive vias 134D. For example, as shown in FIG. 2B, the top surfaces of the conductive vias 134D are substantially coplanar to the top surface of the protection layer 135D; and thus, there is a high degree of coplanarity between the top surfaces of the conductive vias 134D and the top surface of the protection layer 135D.

In some embodiments, the formations and materials of the conductive pads 131C~131D, the passivation layers 132C~132D, the post-passivation layers 133C~133D, the conductive vias 134C~134D, and the protection layers 135C~135D may be the same as or similar to the materials of the conductive pads 131A~131B, the passivation layers 132A~132B, the post-passivation layers 133A~133B, the conductive vias 134A~134B, and the protection layers 135A~135B, respectively; and thus, will not be repeated herein. In some embodiments, the formations and materials of the conductive pads 131C~131D, the passivation layers 132C~132D, the post-passivation layers 133C~133D, the conductive vias 134C~134D, and the protection layers 135C~135D may be different from the materials of the conductive pads 131A~131B, the passivation layers 132A~132B, the post-passivation layers 133A~133B, the conductive vias 134A~134B, and the protection layers 135A~135B, the disclosure is not limited thereto.

In some embodiments, in the semiconductor substrate 110C, the TSVs 142 are embedded therein and electrically connected to the conductive pads 131D. As shown in FIG. 2B, top surfaces S142t of the TSVs 142 are substantially coplanar to the top surface S5 of the semiconductor substrate 110C, and are physically connected to the conductive pads 131D. In some embodiments, the formation and material of the TSVs 142 are similar to the formation and material of the TSVs 140, and thus may not be repeated herein.

Continued on FIG. 2B, in some embodiments, the conductive vias 134C are aligned with the conductive vias 134D, and the protection layer 135C is aligned with the protection layer 135D. Through the conductive vias 134C, the conductive vias 134D, the protection layer 135C, and the protection layer 135D, the semiconductor substrate 110B' and the semiconductor substrate 110C are bonded to each other by hybrid bonding. A bonding interface IF2 is between the semiconductor substrate 110B' and the semiconductor substrate 110C, where the conductive vias 134C of the semiconductor substrate 110B' and the conductive vias 134D of the semiconductor substrate 110C are physically connected and the protection layer 135C of the semiconductor substrate 110B' and the protection layer 135D of the semiconductor substrate 110C are physically connected. In other words, the semiconductor substrate 110B' and the semiconductor substrate 110C are located at two different sides of the bonding interface IF2, for example. In certain embodiments, as shown in FIG. 2B, the semiconductor substrate 110B' and the semiconductor substrate 110C are electrically connected to each other through the conductive vias 134C of the semiconductor substrate 110B' and the conductive vias 134D of the semiconductor substrate 110C. The conductive vias 134C and the conductive vias 134D are referred to as hybrid bonding structures. In addition, the conductive pads 131C/131D, the passivation layers 132C/132D, the post-passivation layers 133C/133D, the conductive vias 134C/134D and the protection layers 135C/135D are together referred to as a circuit structure CS2. In the disclosure, for example, the circuit structure CS1 and the circuit structure CS2 have the same configuration, however the disclosure is not limited thereto. In some embodiments, the circuit structure CS2 may be different from the circuit structure CS1.

Referring to FIG. 2C, in some embodiments, a planarizing step is performed on the bottom surface S6 of the semiconductor substrate 110C to form a semiconductor substrate 110C' having a bottom surface S6' exposing bottom surfaces S142b of the TSVs 142. In some embodiments, the planarizing step may include a grinding process or a CMP process. After the planarizing step, a cleaning step may be optionally performed, for example to clean and remove the residue generated from the planarizing step. However, the disclosure is not limited thereto, and the planarizing step may be performed through any other suitable method. As shown in FIG. 2C, for example, the bottom surfaces S142b of the TSVs 142 is substantially levelled with the bottom surface S6' of the semiconductor substrate 110C'. In other words, the bottom surfaces S142b of the TSVs 142 are substantially coplanar to the bottom surface S6' of the semiconductor substrate 110C'. There is a high degree of coplanarity between the bottom surfaces S142b of the TSVs 142 and the bottom surface S6' of the semiconductor substrate 110C'. Due to the high degree of coplanarity and flatness, the formation of the later-formed layer(s) is beneficial.

Referring to FIG. 2D, in some embodiments, a circuit structure 160 including one or more inter-dielectric layers 162 and one or more patterned conductive layers 164 alternatively arranged is formed on the bottom surface S6' of the semiconductor substrate 110C' to form an integrated circuit component 100B. The formations and materials of the inter-dielectric layers 162 and the patterned conductive layers 164 are described in FIG. 1D, and will not repeated herein.

As shown in FIG. 2D, for example, the circuit structure 160 are electrically connected to the TSVs 142 by physically connecting the bottom surfaces S142b of the TSVs 142 and a bottommost layer of the patterned conductive layers 164 exposed by a lowest layer of the inter-dielectric layers 162. In some embodiments, a topmost layer of the patterned conductive layers 164 is exposed by a most upper layer of the inter-dielectric layers 162 for connecting later-formed component(s), however the disclosure is not limited thereto. In an alternative embodiment, the topmost layer of the patterned conductive layers 164 is completely covered by the most upper layer of the inter-dielectric layers 162 for preventing damages due to transferring or transportation. In such embodiment, a grinding step may be required to at least partially remove the most upper layer of the inter-dielectric layers 162 and expose the topmost layer of the patterned conductive layers 164 for connecting later-formed component(s).

In some embodiments, a dicing process (e.g., singulation) is performed to cut a plurality of the integrated circuit components 100B connected to each other into singulated and separate integrated circuit components 100B. In some embodiments, the dicing process may include mechanical sawing or laser cutting, however the disclosure is not limited thereto. Then, the previously described manufacturing process as described in FIG. 1E to FIG. 1I above can be performed with the use of the integrated circuit component 100B to obtain the semiconductor package and/or a PoP device, based on the demand.

Figure 3B:
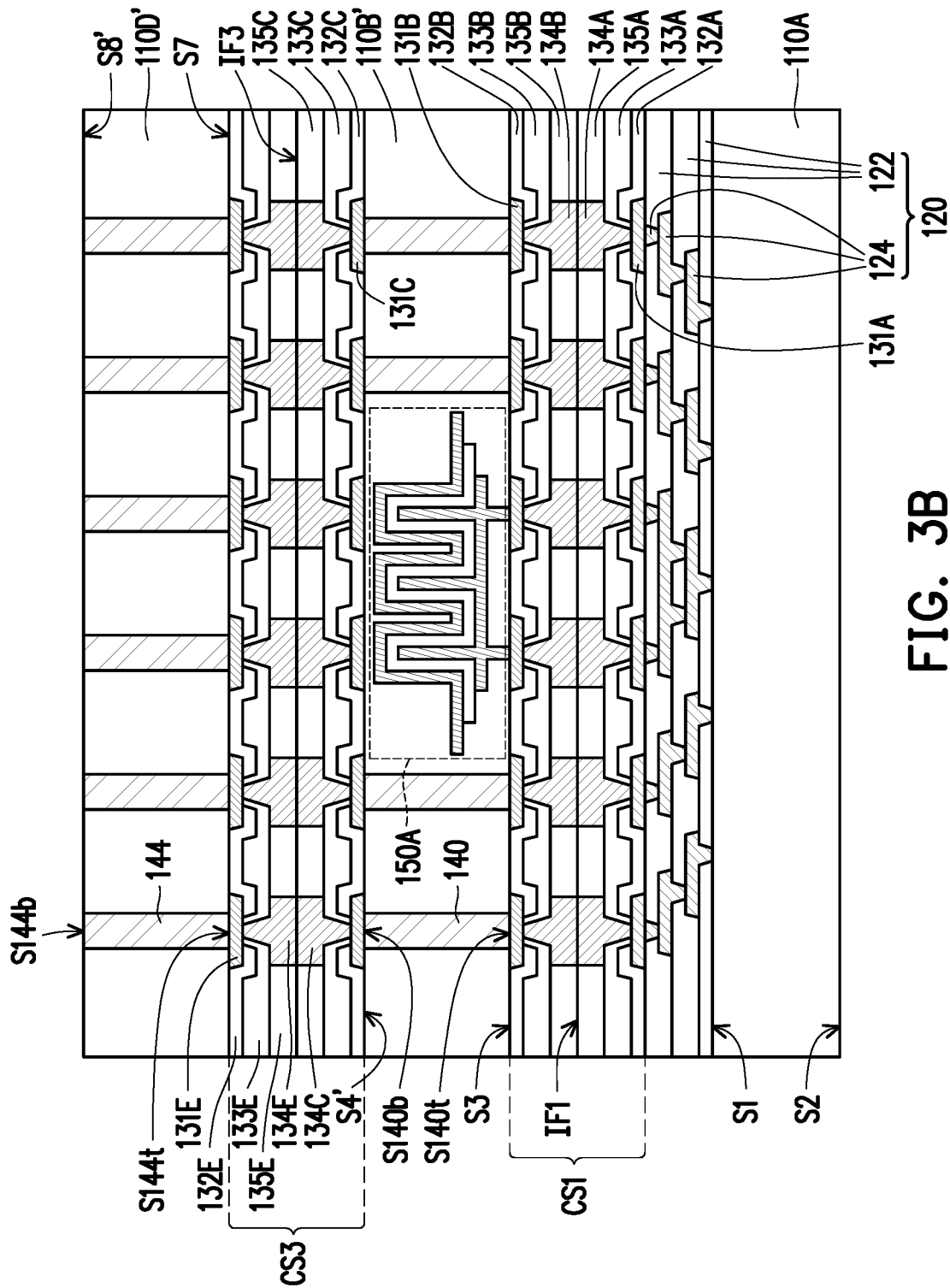
Figure 3C:
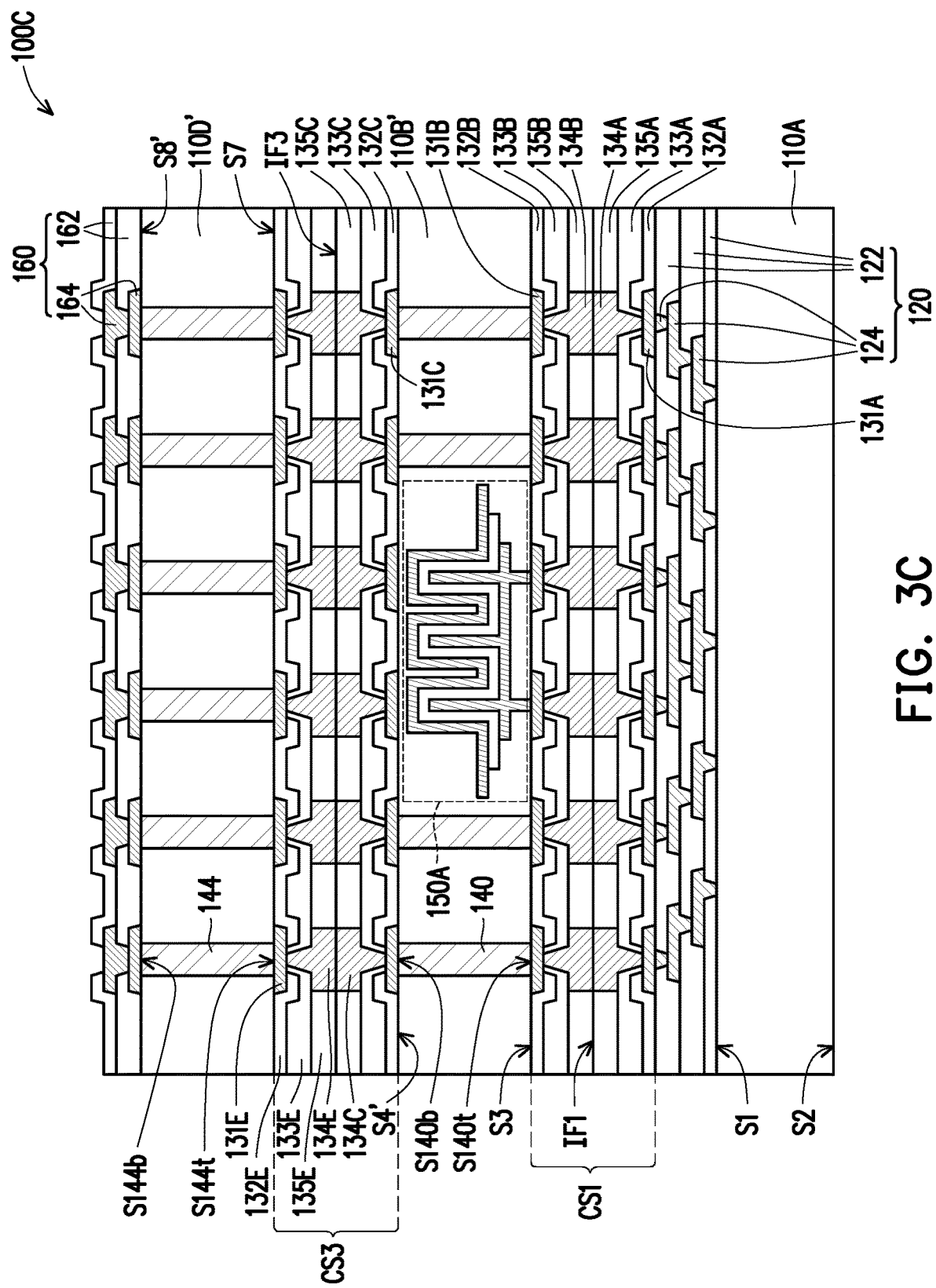

FIG. 3A to FIG. 3C are schematic cross sectional views of various stages in a manufacturing method of an integrated circuit component of a package structure in accordance with some embodiments of the disclosure. The elements similar to or substantially the same as the elements described previously will use the same reference numbers, and certain details or descriptions (e.g. formation methods, materials, and so on) of the same elements may not be repeated herein.

Referring to FIG. 3A, in some embodiments, a semiconductor substrate 110D is picked and placed on the semiconductor substrate 110B' and is boned to the semiconductor substrate 110B' by hybrid bonding following the process as described in FIG. 2A. For example, the hybrid bonding process may include hydrophilic fusion bonding process or hydrophobic fusion bonding process. In one embodiment, a hydrophilic fusion bonding process is performed, where a workable bonding temperature approximately ranges from 150° C. to 400° C. and a workable bonding pressure is approximately greater than 2 J/m$^2$; however, the disclosure is not specifically limited thereto.

In some embodiments, the semiconductor substrate 110D includes conductive pads 131E, a passivation layer 132E, a post-passivation layer 133E, conductive vias 134E, a protection layer 135E, through silicon vias (TSVs) 144, and at least one active device. In alternative embodiments, the semiconductor substrate 110D may further include an interconnection structure similar to the interconnection structure 120. In one embodiment, the material of the semiconductor substrate 110D may be the same as the semiconductor substrate 110A/110B/110C, and thus the material thereof will not be repeated herein. In some embodiments, the active device may be a cache device, a memory device, a memory device stack, or combinations thereof, the disclosure is not limited thereto. For simplicity, the active device formed in the semiconductor substrate 110D is omitted.

In some embodiments, the semiconductor substrate 110D includes the TSVs 144 embedded therein and electrically connected to the conductive pads 131E. As shown in FIG. 3A, top surfaces S144t of the TSVs 144 are substantially coplanar to the top surface S7 of the semiconductor substrate 110D, and are physically connected to the conductive pads 131E. In some embodiments, the formation and material of the TSVs 144 are similar to the formations and materials of the TSVs 140, 142, and thus may not be repeated herein.

In some embodiments, the semiconductor substrate 110D has a top surface S7 and a bottom surface S8 opposite to the top surface S7. As shown in FIG. 3A, for example, the conductive pads 131E are formed on the top surface S7 of the semiconductor substrate 110D and electrically connected to the TSVs 144, the passivation layer 132E is formed on the conductive pads 131E and has openings exposing the conductive pads 131E, the post-passivation layer 133E is formed on the passivation layer 132E and has openings exposing the conductive pads 131E, the conductive vias 134E are respectively formed on and connected to the conductive pads 131E exposed by the passivation layer 132E and the post-passivation layer 133E, and the protection layer 135E covers the post-passivation layer 133E and at least wraps sidewalls of the conductive vias 134E. For example, as shown in FIG. 3A, the top surfaces of the conductive vias 134E are substantially coplanar to the top surface of the protection layer 135E; and thus, there is a high degree of coplanarity between the top surfaces of the conductive vias 134E and the top surface of the protection layer 135E.

In some embodiments, the formations and materials of the conductive pads 131E, the passivation layers 132E, the post-passivation layers 133E, the conductive vias 134E, and the protection layers 135E may be the same as or similar to the materials of the conductive pads 131A~131D, the passivation layers 132A~132D, the post-passivation layers 133A~133D, the conductive vias 134A~134D, and the protection layers 135A~135D, respectively; and thus, will not be repeated herein. In some embodiments, the formations and materials of the conductive pads 131E, the passivation layers 132E, the post-passivation layers 133E, the conductive vias 134E, and the protection layers 135E may be different from the materials of the conductive pads 131A~131D, the passivation layers 132A~132D, the post-passivation layers 133A~133D, the conductive vias 134A~134D, and the protection layers 135A~135D, the disclosure is not limited thereto.

Continued on FIG. 3A, in some embodiments, the conductive vias 134C are aligned with the conductive vias 134E, and the protection layer 135C is aligned with the protection layer 135E. Through the conductive vias 134C, the conductive vias 134E, the protection layer 135C, and the protection layer 135E, the semiconductor substrate 110B' and the semiconductor substrate 110D are bonded to each other by hybrid bonding. A bonding interface IF3 is between the semiconductor substrate 110B' and the semiconductor substrate 110D, where the conductive vias 134C of the semiconductor substrate 110B' and the conductive vias 134E of the semiconductor substrate 110D are physically connected and the protection layer 135C of the semiconductor substrate 110B' and the protection layer 135E of the semiconductor substrate 110D are physically connected. In other words, the semiconductor substrate 110B' and the semiconductor substrate 110D are located at two different sides of the bonding interface IF3, for example. In certain embodiments, as shown in FIG. 3A, the semiconductor substrate 110B' and the semiconductor substrate 110D are electrically connected to each other through the conductive vias 134C of the semiconductor substrate 110B' and the conductive vias 134E of the semiconductor substrate 110D. The conductive vias 134C and the conductive vias 134E are referred to as hybrid bonding structures. In addition, the conductive pads 131C/131E, the passivation layers 132C/132E, the post-passivation layers 133C/133E, the conductive vias 134C/134E and the protection layers 135C/135E are together referred to as a circuit structure CS3. In the disclosure, for example, the circuit structure CS1 and the circuit structure CS3 have the same configuration, however the disclosure is not limited thereto. In some embodiments, the circuit structure CS3 may be different from the circuit structure CS1.

Referring to FIG. 3B, in some embodiments, a planarizing step is performed on the bottom surface S8 of the semiconductor substrate 110D to form a semiconductor substrate 110D' having a bottom surface S8' exposing bottom surfaces S144b of the TSVs 144. In some embodiments, the planarizing step may include a grinding process or a CMP process. After the planarizing step, a cleaning step may be optionally performed, for example to clean and remove the residue generated from the planarizing step. However, the disclosure is not limited thereto, and the planarizing step may be performed through any other suitable method. As shown in FIG. 3B, for example, the bottom surfaces S144b of the TSVs 144 is substantially levelled with the bottom surface S8' of the semiconductor substrate 110D'. In other words, the bottom surfaces S144b of the TSVs 144 are substantially coplanar to the bottom surface S8' of the semiconductor substrate 110D'. There is a high degree of coplanarity between the bottom surfaces S144b of the TSVs 144 and the bottom surface S8' of the semiconductor substrate 110D'. Due to the high degree of coplanarity and flatness, the formation of the later-formed layer(s) is beneficial.

Referring to FIG. 3C, in some embodiments, a circuit structure 160 including one or more inter-dielectric layers 162 and one or more patterned conductive layers 164 alternatively arranged is formed on the bottom surface S8' of the semiconductor substrate 110D' to form an integrated circuit component 100C. Due to the semiconductor substrate 110D', in the integrated circuit component 100C, a short electrical connection path from the active device (e.g., the memory device or the cache device, or the like) to the semiconductor substrate 110A is further achieved. The formations and materials of the inter-dielectric layers 162 and the patterned conductive layers 164 are described in FIG. 1D, and will not repeated herein.

As shown in FIG. 3C, for example, the circuit structure 160 are electrically connected to the TSVs 144 by physically connecting the bottom surfaces S144b of the TSVs 144 and a bottommost layer of the patterned conductive layers 164 exposed by a lowest layer of the inter-dielectric layers 162. In some embodiments, a topmost layer of the patterned conductive layers 164 is exposed by a most upper layer of the inter-dielectric layers 162 for connecting later-formed component(s), however the disclosure is not limited thereto. In an alternative embodiment, the topmost layer of the patterned conductive layers 164 is completely covered by the most upper layer of the inter-dielectric layers 162 for preventing damages due to transferring or transportation. In such embodiment, a grinding step may be required to at least partially remove the most upper layer of the inter-dielectric layers 162 and expose the topmost layer of the patterned conductive layers 164 for connecting later-formed component(s).

In some embodiments, a dicing process (e.g., singulation) is performed to cut a plurality of the integrated circuit components 100C connected to each other into singulated and separate integrated circuit components 100C. In some embodiments, the dicing process may include mechanical sawing or laser cutting, however the disclosure is not limited thereto. Then, the previously described manufacturing process as described in FIG. 1E to FIG. 1I above can be performed with the use of the integrated circuit component 100C to obtain the semiconductor package and/or a PoP device, based on the demand.

FIG. 4 is a schematic cross-sectional view of an integrated circuit component of a package structure in accordance with some embodiments of the disclosure. Referring to FIG. 2D and FIG. 4 together, the integrated circuit component 100B depicted in FIG. 2D and the integrated circuit component 100D depicted in FIG. 4 are similar; such that the elements similar to or substantially the same as the elements described above will use the same reference numbers, and certain details or descriptions of the same elements and the relationship thereof (e.g. the relative positioning configuration, electrical connection, formation methods, materials, and so on) will not be repeated herein. Referring to FIG. 2D and FIG. 4 together, the difference is that, the integrated circuit component 100D depicted in FIG. 4 further includes additional components (e.g. at least one circuit structure CS3 and at least one semiconductor substrate 110D' depicted in FIG. 3C) between the circuit structure 160 and the semiconductor substrate 110C'.

In some embodiments, as shown in FIG. 4, in the integrated circuit component 100D, one addition circuit structure CS3 and one additional semiconductor substrate 110D' (depicted in FIG. 3C) are further included, where the additional circuit structure CS3 is electrically connected to and located between the semiconductor substrate 110C' and the additional semiconductor substrate 110D', and the additional semiconductor substrate 110D' is electrically connected to and located between the additional circuit structure CS3 and the circuit structure 160. However, the disclosure is not limited thereto. In an alternative embodiment of which two or more additional circuit structures CS3 and two or more additional semiconductor substrates 110D' are included, the additional circuit structures CS3 and the additional semiconductor substrates 110D' may be alternatively stacked over one another along a stacking direction of the circuit structure 160 and the semiconductor substrate 110C', and are electrically connected to each other. In the disclosure, the previously described manufacturing process as described in FIG. 1E to FIG. 1I above can be performed with the use of the integrated circuit component 100D to obtain the semiconductor package and/or a PoP device, based on the demand.

FIG. 5 is a schematic cross-sectional view of an integrated circuit component of a package structure in accordance with some embodiments of the disclosure. Referring to FIG. 3C and FIG. 5 together, the integrated circuit component 100C depicted in FIG. 3C and the integrated circuit component 100E depicted in FIG. 5 are similar; such that the elements similar to or substantially the same as the elements described above will use the same reference numbers, and certain details or descriptions of the same elements and the relationship thereof (e.g. the relative positioning configuration, electrical connection, formation methods, materials, and so on) will not be repeated herein. Referring to FIG. 3C and FIG. 5 together, the difference is that, the integrated circuit component 100E depicted in FIG. 5 further includes additional components (e.g. at least one circuit structure CS3, at least one semiconductor substrate 110B', and at least one semiconductor substrate 110D' depicted in FIG. 3C) between the circuit structure 160 and the semiconductor substrate 110D'.

In some embodiments, as shown in FIG. 5, in the integrated circuit component 110E, two additional circuit structure CS3, one additional semiconductor substrate 110B' and one additional semiconductor substrate 110D' (depicted in FIG. 3C) are further included, where one of the additional circuit structures CS3 is electrically connected to and located between the additional semiconductor substrate 110B' and the semiconductor substrate 110D', the additional semiconductor substrate 110B' is electrically connected to and located between the one of the additional circuit structures CS3 and other one of the additional circuit structures CS3, the other one of the additional circuit structures CS3 is electrically connected to and located between the addition semiconductor substrate 110B' and the additional semiconductor substrate 110D', and the additional semiconductor substrate 110D' is electrically connected to and located between the other one of the additional circuit structures CS3 and the circuit structure 160. In other words, for example, the additional circuit structures CS3 and the additional semiconductor substrates 110B'/110D' are alternatively stacked over one another along a stacking direction of the circuit structure 160 and the semiconductor substrate 110D', and are electrically connected to each other. The numbers of the additional circuit structures CS3 and additional semiconductor substrates 110B'/110D' may be selected based on the demand, and is not limited to the disclosure. In the disclosure, the previously described manufacturing process as described in FIG. 1E to FIG. 1I above can be performed with the use of the integrated circuit component 100E to obtain the semiconductor package and/or a PoP device, based on the demand.

However, the disclosure is not limited thereto. The numbers of the semiconductor substrate 110B'~110D' and the circuit structure CS1~CS3 disposed on the semiconductor substrate 110A with the interconnection structure 120 disposed thereon may be designated and selected based on the design layout and the demand.

Figure 6:
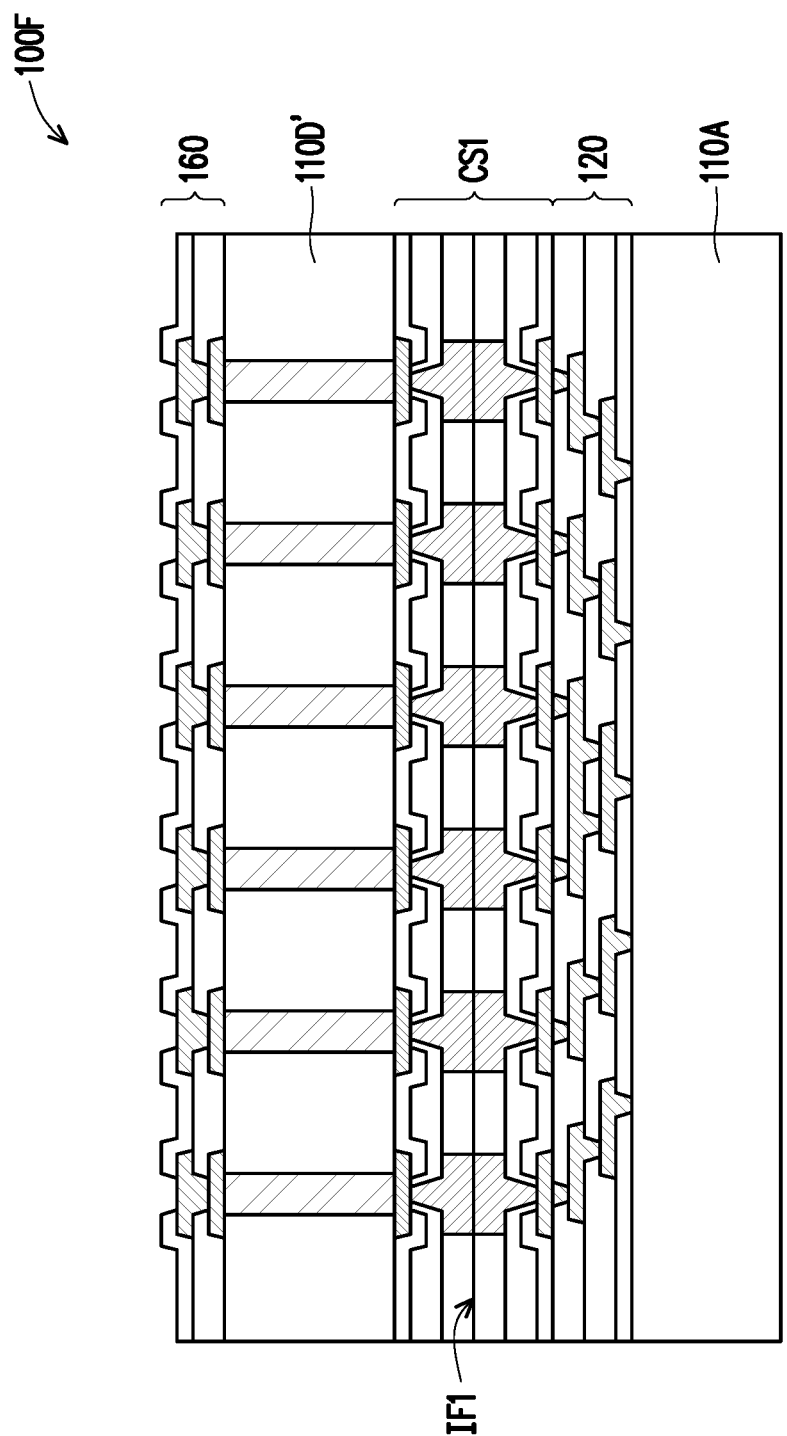
FIG. 6 is a schematic cross-sectional view of an integrated circuit component included a package structure in accordance with some embodiments of the disclosure.
Figure 7:
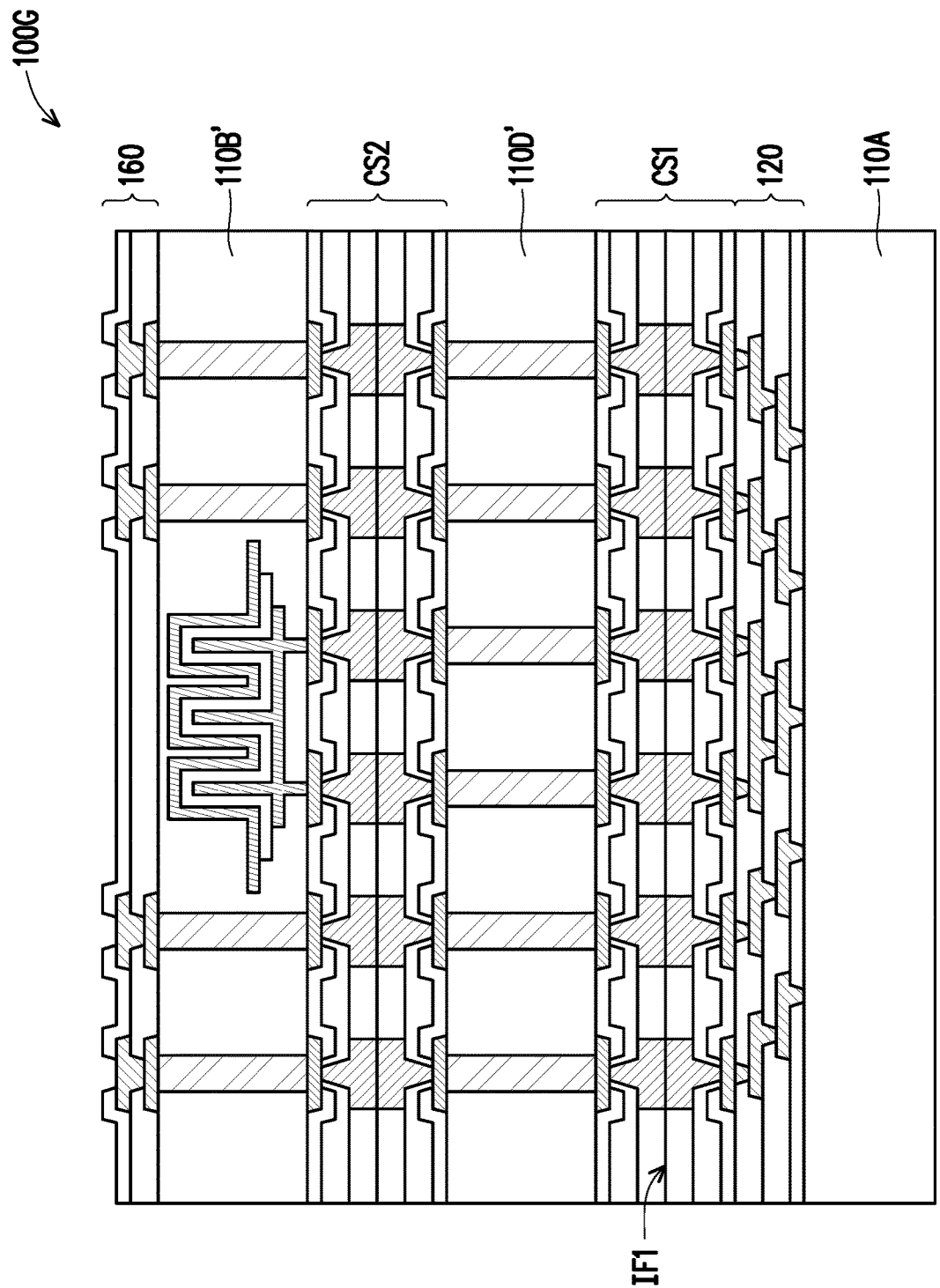
FIG. 7 is a schematic cross-sectional view of an integrated circuit component included a package structure in accordance with some embodiments of the disclosure.
Figure 8:
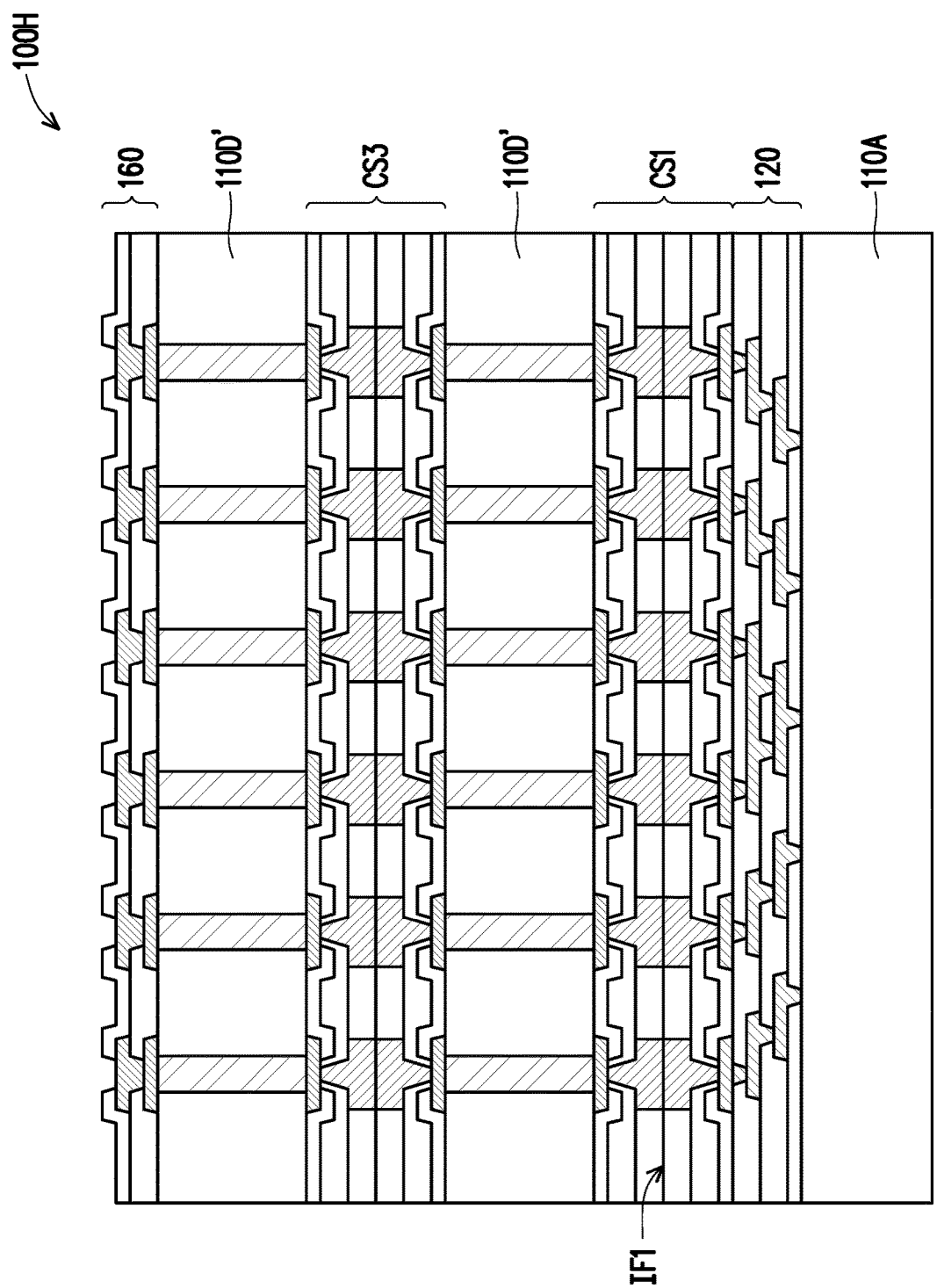
FIG. 8 is a schematic cross-sectional view of an integrated circuit component included a package structure in accordance with some embodiments of the disclosure.
Figure 9:
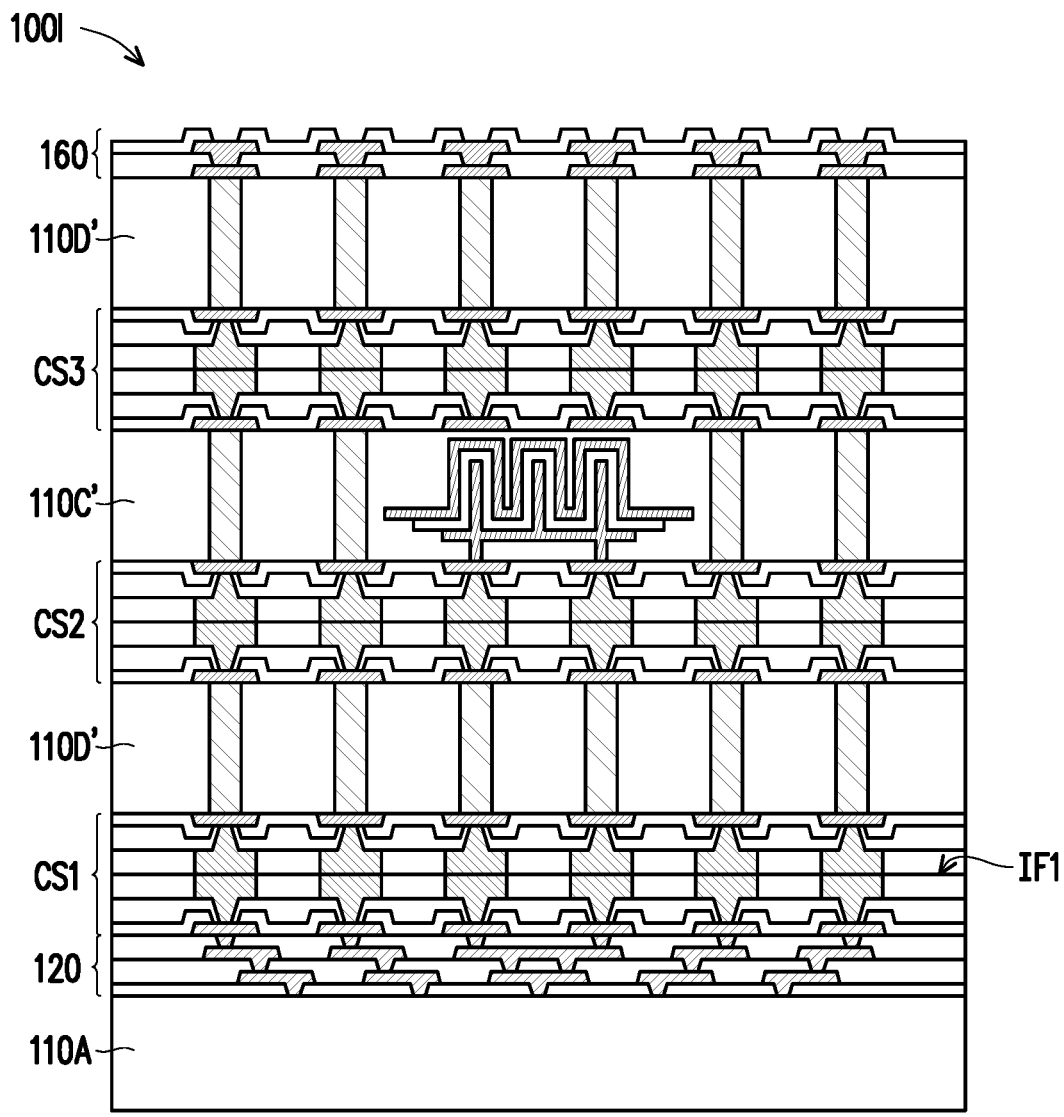
FIG. 9 is a schematic cross-sectional view of an integrated circuit component included a package structure in accordance with some embodiments of the disclosure.
Figure 10:
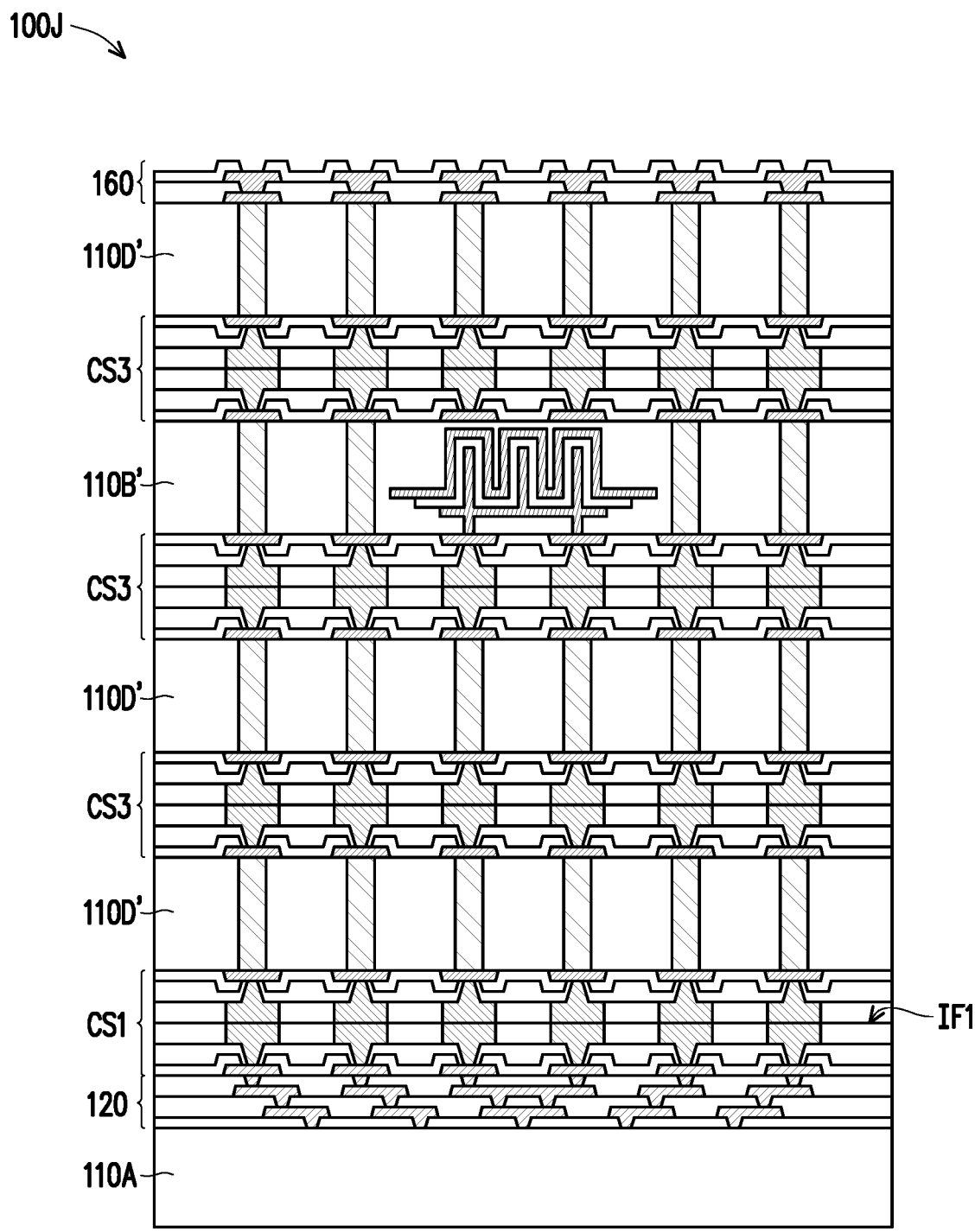
FIG. 10 is a schematic cross-sectional view of an integrated circuit component included a package structure in accordance with some embodiments of the disclosure.

In some further alternative embodiments, the semiconductor substrate 110B' depicted in the integrated circuit components 100A-100E may be replaced by the semiconductor substrate 110D', see an integrated circuit components 100F in FIG. 6, an integrated circuit components 100G in FIG. 7, an integrated circuit components 100H in FIG. 8, an integrated circuit components 100I in FIG. 9, and an integrated circuit components 100J in FIG. 10. The elements similar to or substantially the same as the elements described previously will use the same reference numbers, and certain details or descriptions (e.g. formation methods, materials, electrical and physical connectivity and so on) of the same elements may not be repeated herein. As described in FIG. 3A to FIG. 3C, the semiconductor substrate 110D' includes at least one active device. In some embodiments, the active device may be a cache device, a memory device, a memory device stack, or combinations thereof, the disclosure is not limited thereto. For simplicity, the active device formed in the semiconductor substrate 110D' is omitted.

Figure 11:
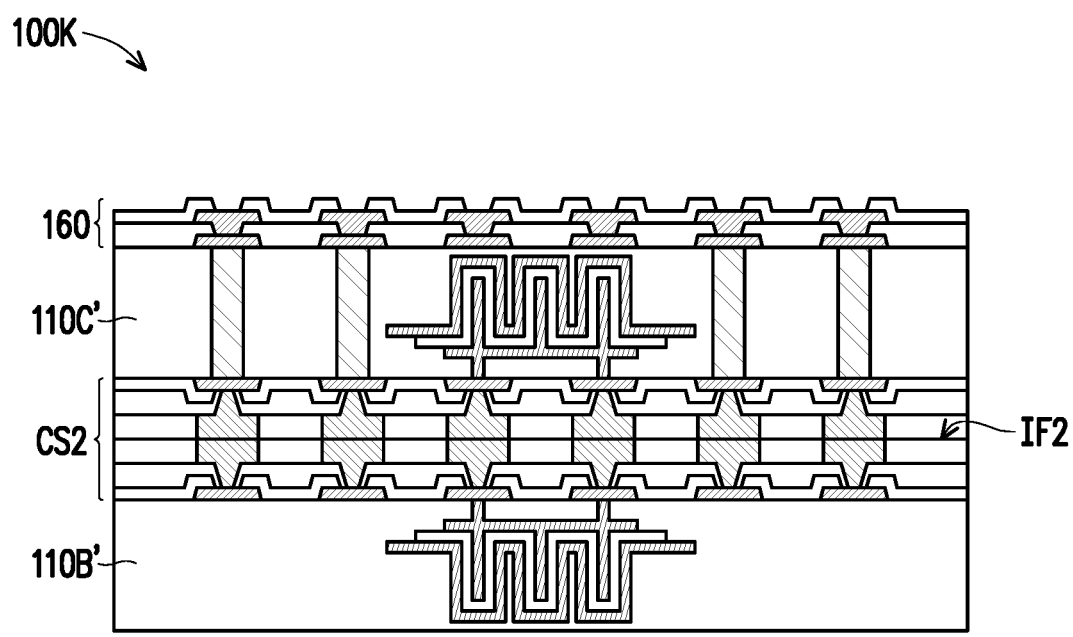
FIG. 11 is a schematic cross-sectional view of an integrated circuit component included a package structure in accordance with some embodiments of the disclosure.

However, the disclosure is not limited thereto. In an alternative embodiment, the integrated circuit component of the disclosure may include only passive device(s) such as capacitors embedded in the semiconductor substrates; or saying, may not include active device(s). FIG. 11 is a schematic cross-sectional view of an integrated circuit component included a package structure in accordance with some embodiments of the disclosure. Referring to FIG. 2D and FIG. 11 together, the integrated circuit component 100B depicted in FIG. 2D and the integrated circuit component 100K depicted in FIG. 11 are similar; such that the elements similar to or substantially the same as the elements described above will use the same reference numbers, and certain details or descriptions of the same elements and the relationship thereof (e.g. the relative positioning configuration, electrical connection, formation methods, materials, and so on) will not be repeated herein. Referring to FIG. 2D and FIG. 11 together, the difference is that, the integrated circuit component 100K depicted in FIG. 11 excludes the semiconductor substrate 110A, the interconnection structure 120, the circuit structure CS1, and the TSVs 140 embedded in the semiconductor substrate 110B', where the semiconductor substrate 110B' and the semiconductor substrate 110C' are bonded together with the circuit structure CS2 (e.g. the bonding interface IF2) and have no active device(s) embedded therein. As shown in FIG. 11, the capacitor embedded in the semiconductor substrate 110B' and the capacitor embedded in the semiconductor substrate 110C' may electrically connected to each other through the circuit structure CS2. In some embodiments, the capacitor (e.g. the capacitor 150A depicted in FIG. 2D) embedded in the semiconductor substrate 110B' and the capacitor (e.g. the capacitor 150B depicted in FIG. 2D) embedded in the semiconductor substrate 110C' may be electrically connected to the circuit structure 160 through the circuit structure CS2 and the TSVs (e.g. the TSVs 142 depicted in FIG. 2D) embedded in the semiconductor substrate 110C'.

In accordance with some embodiments, a semiconductor structure includes at least one integrated circuit component. The at least one integrated circuit component includes a first semiconductor substrate and a second semiconductor substrate electrically coupled to the first semiconductor substrate, wherein the first semiconductor substrate and the second semiconductor substrate are bonded through a first hybrid bonding interface, and at least one of the first semiconductor substrate or the second semiconductor substrate includes at least one first embedded capacitor.

In accordance with some embodiments, a package structure includes at least one integrated circuit component, an insulating encapsulation, and a redistribution structure. The at least one integrated circuit component includes a first semiconductor substrate having at least one first active device therein and a second semiconductor substrate having at least one first capacitor embedded therein. The second semiconductor substrate is electrically coupled to the first semiconductor substrate, wherein the first semiconductor substrate and the second semiconductor substrate are bonded through a first hybrid bonding interface. The insulating encapsulation encapsulates the at least one integrated circuit component. The redistribution structure is located on the insulating encapsulation and electrically coupled to the at least one integrated circuit component.

In accordance with some embodiments, a manufacturing method of a semiconductor structure includes forming at least one integrated circuit component through the following steps: providing a first semiconductor substrate and a second semiconductor substrate, wherein at least one of the first semiconductor substrate and the second semiconductor substrate comprises at least one first embedded capacitor; and performing a first fusion bonding step to bonding the first semiconductor substrate and the second semiconductor substrate for electrically connection thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
at least one integrated circuit component, comprising:

a first semiconductor substrate and a second semiconductor substrate electrically coupled to the first semiconductor substrate, wherein the first semiconductor substrate and the second semiconductor substrate are bonded through a first hybrid bonding interface, at least one of the first semiconductor substrate or the second semiconductor substrate comprises at least one first embedded capacitor, and the second semiconductor substrate comprises first through silicon vias penetrating therethrough, wherein the first through silicon vias are free from the first semiconductor substrate.

2. The semiconductor structure of claim 1, wherein the first semiconductor substrate comprises first hybrid bonding structures disposed on a first side of the first semiconductor substrate, the second semiconductor substrate comprises second hybrid bonding structures disposed on a second side of the second semiconductor substrate, and the first semiconductor substrate and the second semiconductor substrate are electrically coupled to each other through bonding the first hybrid bonding structures and the second hybrid bonding structures.

3. The semiconductor structure of claim 1, wherein the at least one first embedded capacitor comprises a trench capacitor, and a capacitance density of the at least one first embedded capacitor is greater than or substantially equal to nF/mm².

4. The semiconductor structure of claim 1, wherein the first through silicon vias are electrically coupled to the first semiconductor substrate.

5. The semiconductor structure of claim 1, wherein the at least one integrated circuit component further comprises a third semiconductor substrate, and the second semiconductor substrate and the third semiconductor substrate are bonded through a second hybrid bonding interface, wherein the second semiconductor substrate is located between the first semiconductor substrate and the third semiconductor substrate.

6. The semiconductor structure of claim 5, wherein the second semiconductor substrate comprises third hybrid bonding structures disposed on a third side opposite to the second side, the third semiconductor substrate comprises fourth hybrid bonding structures disposed on a fourth side of the third semiconductor substrate, and the second semiconductor substrate and the third semiconductor substrate are electrically coupled to each other through bonding the third hybrid bonding structures and the fourth hybrid bonding structures.

7. The semiconductor structure of claim 5, wherein the third semiconductor substrate further comprises at least one second embedded capacitor.

8. The semiconductor structure of claim 7, wherein the third semiconductor substrate further comprises second through silicon vias arranged aside of a positioning location of the at least one second embedded capacitor, and the second through silicon vias are electrically coupled to the first semiconductor substrate.

9. The semiconductor structure of claim 7, wherein the at least one second embedded capacitor comprises a trench capacitor, and a capacitance density of the at least one second embedded capacitor is greater than or substantially equal to 100 nF/mm².

10. A package structure, comprising:
at least one integrated circuit component, comprising:
a first semiconductor substrate having at least one first active device therein; and
a second semiconductor substrate having at least one first capacitor embedded therein, electrically coupled to the first semiconductor substrate, wherein the second semiconductor substrate comprises first through silicon vias penetrating therethrough, the first semiconductor substrate and the second semiconductor substrate are bonded through a first hybrid bonding interface being free of the first through silicon vias;
an insulating encapsulation, encapsulating the at least one integrated circuit component; and
a redistribution structure, located on the insulating encapsulation and electrically coupled to the at least one integrated circuit component.

11. The package structure of claim 10, wherein the first semiconductor substrate further comprises first hybrid bonding structures disposed on an active surface of the first semiconductor substrate, the second semiconductor substrate further comprises second hybrid bonding structures disposed on a first side of the second semiconductor substrate, and the first semiconductor substrate and the second semiconductor substrate are electrically coupled to each other through bonding the first hybrid bonding structures and the second hybrid bonding structures.

12. The package structure of claim 10, wherein the first through silicon vias are arranged aside of a positioning location of the at least one first capacitor, and the first through silicon vias are electrically coupled to the first semiconductor substrate.

13. The package structure of claim 10, wherein the at least one integrated circuit component further comprises a third semiconductor substrate having at least one second active device or at least one second capacitor embedded therein, and the second semiconductor substrate and the third semiconductor substrate are bonded through a second hybrid bonding interface, wherein the second semiconductor substrate is located between the first semiconductor substrate and the third semiconductor substrate.

14. The package structure of claim 13, wherein the second semiconductor substrate further comprises third hybrid bonding structures disposed on a second side opposite to the first side, the third semiconductor substrate further comprises fourth hybrid bonding structures disposed on an active surface of the third semiconductor substrate, and the second semiconductor substrate and the third semiconductor substrate are electrically coupled to each other through bonding the third hybrid bonding structures and the fourth hybrid bonding structures.

15. The package structure of claim 13, wherein the third semiconductor substrate further comprises second through silicon vias arranged aside of a positioning location of the at least one second active device or the at least one second capacitor, and the second through silicon vias are electrically coupled to the first semiconductor substrate.

16. The package structure of claim 13, wherein the at least one first capacitor and the at least one second capacitor comprise trench capacitors having a capacitance density greater than or substantially equal to 100 nF/mm².

17. The package structure of claim 13, wherein the at least one second active device comprises a cache device, a memory device, a memory device stack, or combinations thereof.

18. A manufacturing method of a semiconductor structure, comprising:
forming at least one integrated circuit component, comprising:

providing a first semiconductor substrate and a second semiconductor substrate, wherein at least one of the first semiconductor substrate and the second semiconductor substrate comprises at least one first embedded capacitor, and the second semiconductor substrate comprises first through silicon vias penetrating therethrough, wherein the first through silicon vias are free from the first semiconductor substrate; and performing a first fusion bonding step to bond the first semiconductor substrate and the second semiconductor substrate for electrically connection thereof.

19. The manufacturing method of claim 18, wherein forming the at least one integrated circuit component further comprises:

providing a third semiconductor substrate having at least one first active device or at least one second embedded capacitor; and performing a second fusion bonding step to bond the second semiconductor substrate and the third semiconductor substrate for electrically connection thereof, wherein the second semiconductor substrate is disposed between the first semiconductor substrate and the third semiconductor substrate.

20. A manufacturing method of a package structure, comprising:

forming a semiconductor structure as claimed in claim 18;

disposing the semiconductor structure on a carrier;

forming an insulating encapsulation to encapsulate the semiconductor structure;

planarizing the insulating encapsulation;

forming a redistribution structure on the semiconductor structure and on the insulating encapsulation; and disposing conductive elements on the redistribution structure.

* * * * *